US012635572B2

(12) United States Patent
Chen et al.

(10) Patent No.: US 12,635,572 B2
(45) Date of Patent: May 19, 2026

(54) PACKAGE STRUCTURE AND METHOD FOR MANUFACTURING THE SAME

(71) Applicant: Advanced Semiconductor Engineering, Inc., Kaohsiung (TW)

(72) Inventors: Chien-Hua Chen, Kaohsiung (TW); Cheng-Yuan Kung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 651 days.

(21) Appl. No.: 17/987,693

(22) Filed: Nov. 15, 2022

(65) Prior Publication Data

US 2023/0075336 A1    Mar. 9, 2023

Related U.S. Application Data

(63) Continuation of application No. 16/518,837, filed on Jul. 22, 2019, now Pat. No. 11,502,067.

(Continued)

(51) Int. Cl.
*H01L 25/10*      (2006.01)
*H01L 23/522*     (2006.01)
(Continued)

(52) U.S. Cl.
CPC .......... *H01L 25/10* (2013.01); *H01L 23/5227* (2013.01); *H03H 9/60* (2013.01); *H03H 9/6456* (2013.01); *H10N 30/02* (2023.02); *H10N 30/03* (2023.02); *H10N 30/875* (2023.02); *H10N 30/88* (2023.02)

(58) Field of Classification Search
CPC ............ H03H 9/54; H03H 9/70; H10N 30/03; H10N 30/88; H01L 25/10
See application file for complete search history.

(56) References Cited

U.S. PATENT DOCUMENTS 7,999,632 B2 *  8/2011  Iwamoto .............. H03H 9/0576
                                              29/25.35
8,294,535 B2   10/2012  Feiertag et al.
(Continued)

OTHER PUBLICATIONS

Final Office Action for U.S. Appl. No. 16/518,837, issued Sep. 30, 2021, 10 pages.

(Continued)

*Primary Examiner* — Andrea Lindgren Baltzell
*Assistant Examiner* — Alan Wong
(74) *Attorney, Agent, or Firm* — Foley & Lardner LLP

(57) ABSTRACT
A semiconductor package structure includes a plurality of transducer devices, a cap structure, at least one redistribution layer (RDL) and a protection material. The transducer devices are disposed side by side. Each of the transducer devices has at least one transducing region, and includes a die body and at least one transducing element. The die body has a first surface and a second surface opposite to the first surface. The transducing region is disposed adjacent to the first surface of the die body. The transducing element is disposed adjacent to the first surface of the die body and within the transducing region. The cap structure covers the transducing region of the transducer device to form an enclosed space. The redistribution layer (RDL) electrically connects the transducer devices. The protection material covers the transducer devices.

4 Claims, 37 Drawing Sheets

Related U.S. Application Data

(60) Provisional application No. 62/703,768, filed on Jul. 26, 2018.

(51) Int. Cl.

| | |
|---|---|
| *H03H 9/60* | (2006.01) |
| *H03H 9/64* | (2006.01) |
| *H10N 30/02* | (2023.01) |
| *H10N 30/03* | (2023.01) |
| *H10N 30/87* | (2023.01) |
| *H10N 30/88* | (2023.01) |

(56) References Cited

U.S. PATENT DOCUMENTS

| | | | | |
|---|---|---|---|---|
| 8,361,842 | B2 | 1/2013 | Yu et al. | |
| 8,461,940 | B2 * | 6/2013 | Takada | H03H 3/00 |
| | | | | 333/186 |
| 9,209,380 | B2 | 12/2015 | Combe et al. | |
| 9,647,196 | B2 * | 5/2017 | Bauer | H10N 30/03 |
| 9,721,922 | B2 * | 8/2017 | Marimuthu | H01L 24/03 |
| 10,157,888 | B1 | 12/2018 | Lin et al. | |
| 10,283,473 | B1 * | 5/2019 | Yu | H01L 25/50 |
| 10,290,598 | B2 | 5/2019 | Lee et al. | |
| 10,333,493 | B2 | 6/2019 | Nagarkar et al. | |
| 10,541,228 | B2 | 1/2020 | Chen et al. | |
| 10,629,468 | B2 | 4/2020 | Yota et al. | |
| 10,847,470 | B2 * | 11/2020 | Liao | H01L 24/96 |
| 11,031,919 | B2 | 6/2021 | Nambu et al. | |
| 11,502,067 | B2 * | 11/2022 | Chen | H10N 30/88 |
| 11,791,797 | B2 * | 10/2023 | Kawasaki | H03H 9/6483 |
| | | | | 333/193 |

OTHER PUBLICATIONS

Non-Final Office Action for U.S. Appl. No. 16/518,837, issued Apr. 2, 2021, 11 pages.

Non-Final Office Action for U.S. Appl. No. 16/518,837, issued Feb. 4, 2022, 13 pages.

Notice of Allowance for U.S. Appl. No. 16/518,837, issued Jul. 12, 2022, 11 pages.

* cited by examiner

363

36
46

343

34
36
46

363

351

35

PACKAGE STRUCTURE AND METHOD FOR MANUFACTURING THE SAME

CROSS-REFERENCE TO RELATED APPLICATIONS

This application is a continuation of U.S. patent application Ser. No. 16/518,837 filed Jul. 22, 2019, now issued as U.S. Pat. No. 11,502,067, which claims the benefit of and priority to U.S. Provisional Application No. 62/703,768, filed Jul. 26, 2018, the contents of which are incorporated herein by reference in their entirety.

BACKGROUND

1. Field of the Disclosure

The present disclosure relates to a package structure and a manufacturing method, and to a package structure including a plurality of transducer devices, and a method for manufacturing the same.

2. Description of the Related Art

Along with the rapid development in electronics industry and the progress of semiconductor processing technologies, semiconductor packages are integrated with an increasing number of electronic devices to achieve improved electrical performance and additional functions. Some electronic devices having the same function may be integrated together to form a module. During a manufacturing process, an electrical connection between the electronic devices in such module is an important issue. In addition, a thickness of such module may influence a thickness of a final product (e.g., the semiconductor package); thus, the thickness of such module is also an important issue.

SUMMARY

In some embodiments, a semiconductor package structure includes a plurality of transducer devices, a cap structure, at least one redistribution layer (RDL) and a protection material. The transducer devices are disposed side by side. Each of the transducer devices has at least one transducing region, and includes a die body and at least one transducing element. The die body has a first surface and a second surface opposite to the first surface. The transducing region is disposed adjacent to the first surface of the die body. The transducing element is disposed adjacent to the first surface of the die body and within the transducing region. The cap structure covers the transducing region of the transducer device to form an enclosed space. The redistribution layer (RDL) electrically connects the transducer devices. The protection material covers the transducer devices.

In some embodiments, a method for manufacturing a package structure includes: (a) disposing a plurality of transducer devices on a carrier side by side, wherein each of the transducer devices has at least one transducing region, and includes a die body and at least one transducing element, the die body has a first surface and a second surface opposite to the first surface, the transducing region is disposed adjacent to the first surface of the die body, the transducing element is disposed adjacent to the first surface of the die body and within the transducing region; (b) forming a protection material to cover the transducer devices; (c) forming a cap structure to cover the transducing region of the transducer device to form an enclosed space; and (d)

forming at least one redistribution layer (RDL) to electrically connecting the transducer devices.

In some embodiments, a method for manufacturing a package structure includes: (a) forming at least one redistribution layer (RDL) on a carrier; (b) electrically connecting a plurality of transducer devices to the redistribution layer (RDL), wherein each of the transducer devices has at least one transducing region, and includes a die body, at least one transducing element and a cap structure, wherein the die body has a first surface and a second surface opposite to the first surface, the transducing region is disposed adjacent to the first surface of the die body, the transducing element is disposed adjacent to the first surface of the die body and within the transducing region, and the cap structure covers the transducing region of the transducer device to form an enclosed space; and (c) forming a protection material to cover the transducer devices.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
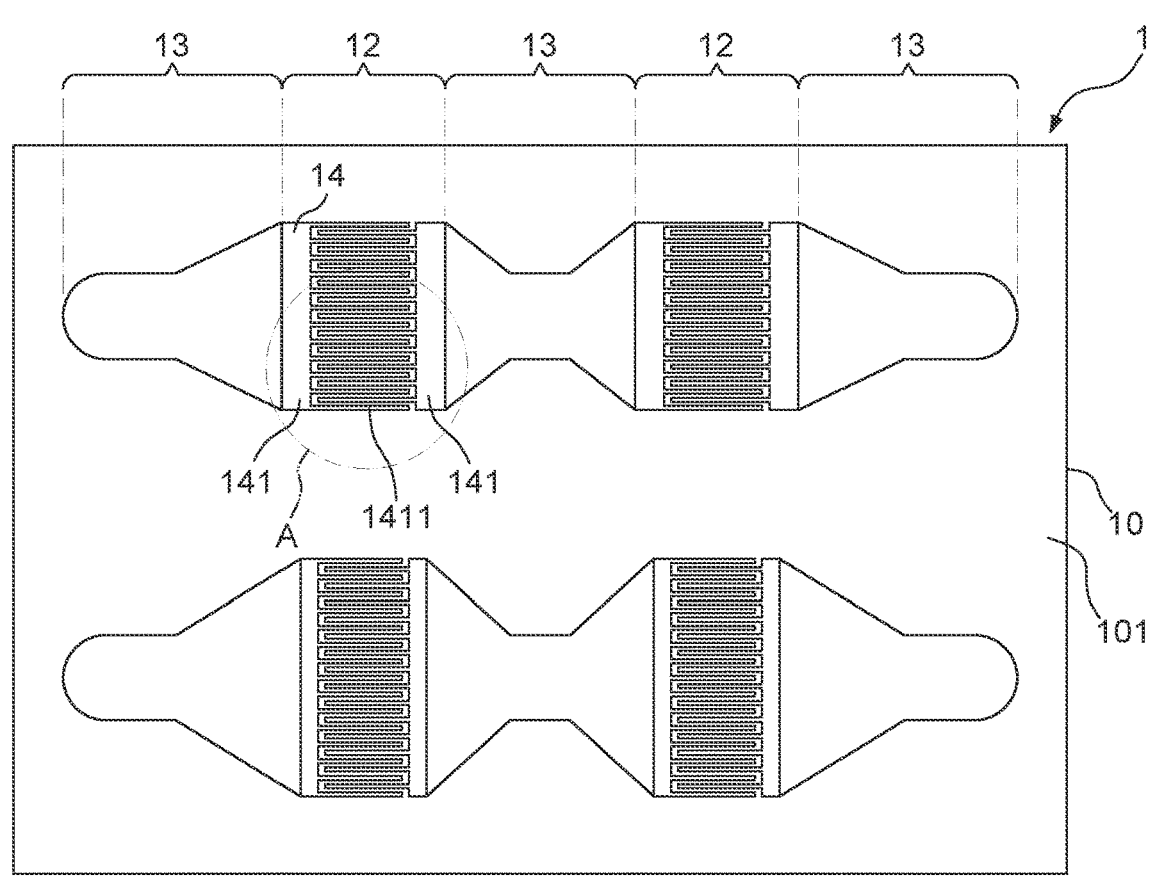
FIG. 1 illustrates a top view of a transducer device according to some embodiments of the present disclosure, wherein an insulation layer is omitted for the purpose of the clear explanation.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
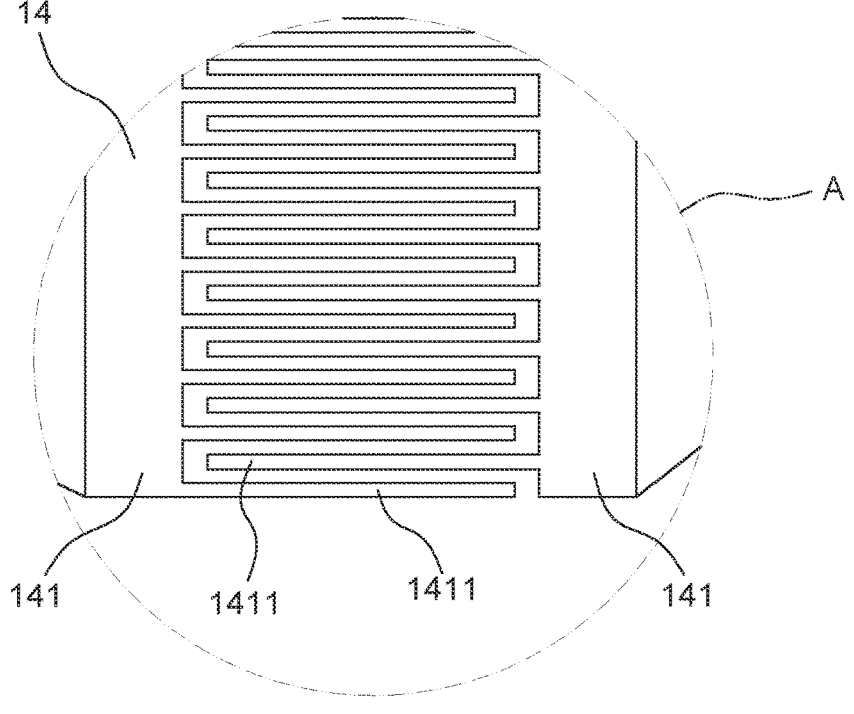
FIG. 2 illustrates an enlarged view of an area "A" shown in FIG. 1.
Figure 3:
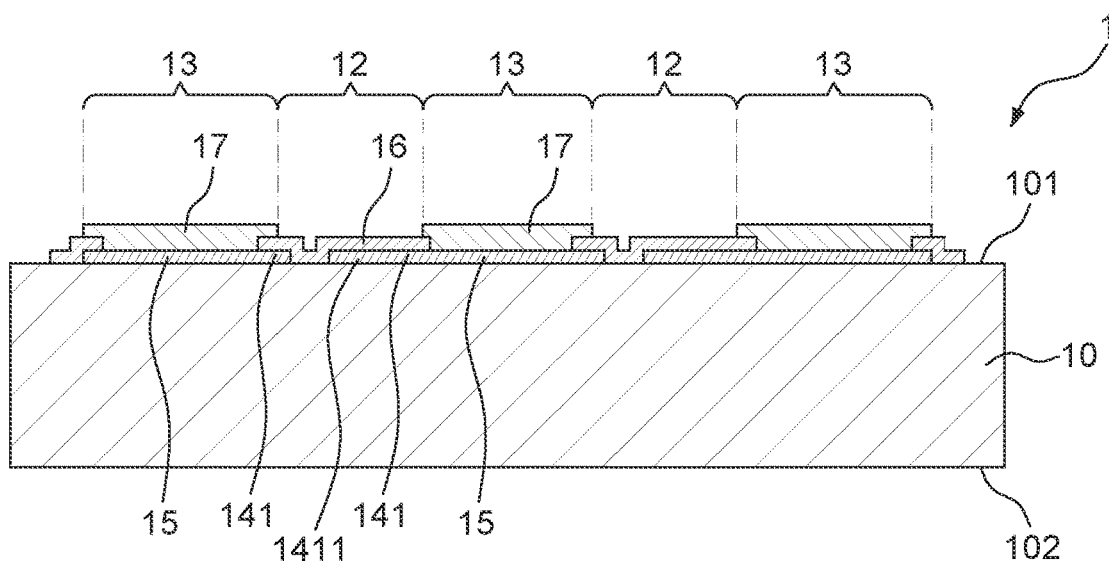
FIG. 3 illustrates a cross-sectional view of the transducer device of FIG. 1.

FIG. 1 illustrates a top view of a transducer device 1 according to some embodiments of the present disclosure, wherein an insulation layer is omitted for the purpose of the clear explanation. FIG. 2 illustrates an enlarged view of an area "A" shown in FIG. 1. FIG. 3 illustrates a cross-sectional view of the transducer device 1 of FIG. 1. The transducer device 1 of FIG. 1 to FIG. 3 may be a surface acoustic wave (SAW) filter that may have at least one transducing region 12 and at least one conductive region 13, and may include a die body 10, at least one transducing element 14, a first metal layer 15, an insulation layer 16 and a second metal layer 17.

The die body 10 has a first surface 101 and a second surface 102 opposite to the first surface 101. The die body 10 is a bare die that is cut from a wafer. A material of the die body 10 may be piezoelectric material. The transducing region 12 and the conductive region 13 are disposed adjacent to the first surface 101 of the die body 10. The first metal layer 15 (e.g., a copper layer) is disposed on the first surface 101 of the die body 10. A portion of the first metal layer 15 disposed in the transducing region 12 is the transducing element 14, and the other portion of the first metal layer 15 is disposed in the conductive region 13. The insulation layer 16 covers and protects the first metal layer 15 in the transducing region 12. The second metal layer 17 (e.g., a copper layer) is disposed on the portion of the first metal layer 15 that is in the conductive region 13 for electrical connection. Thus, the thickness of the metal layers (including the first metal layer 15 and the second metal layer 17) in the conductive region 13 is greater than the thickness of the metal layers (solely including the first metal layer 15) in the transducing region 12. The transducing element 14 is disposed adjacent to the first surface 101 of the die body 10 and within the transducing region 12, and includes at least a pair of inter-digital transducer (IDT) electrodes 141. Each of the inter-digital transducer (IDT) electrodes 141 includes a plurality of electrode fingers 1411 parallel with each other. For example, each of the inter-digital transducer (IDT) electrodes 141 may be in a comb shape. The electrode fingers 1411 of the inter-digital transducer (IDT) electrodes 141 are interlocking, and are in a fashion of a zipper. It is noted that the electrode fingers 1411 of the inter-digital transducer (IDT) electrodes 141 may not contact each other.

Figure 4:
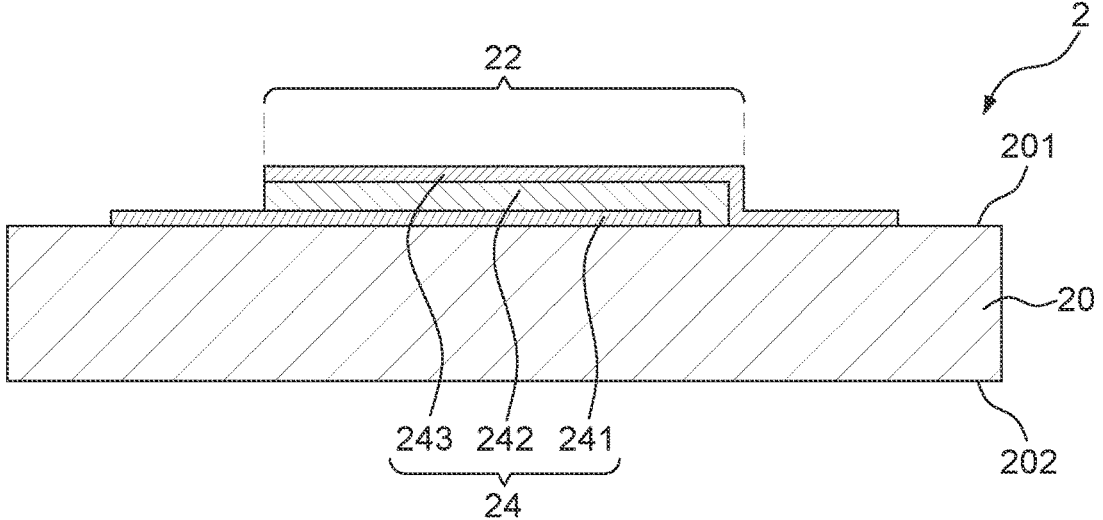
FIG. 4 illustrates a cross-sectional view of a transducer device according to some embodiments of the present disclosure.

FIG. 4 illustrates a cross-sectional view of a transducer device 2 according to some embodiments of the present disclosure. The transducer device 2 of FIG. 4 may be a bulk acoustic wave (BAW) filter that may have at least one transducing region 22, and may include a die body 20, a first electrode 241 (e.g., copper electrode), a piezoelectric material 242, a second electrode 243 (e.g., copper electrode) and at least one transducing element 24. The die body 20 has a first surface 201 and a second surface 202 opposite to the first surface 201. The die body 20 is a bare die that is cut from a wafer. A material of the die body 20 may be silicon. The transducing element 24 is disposed within the transducing region 22, and includes a portion of the first electrode 241, the piezoelectric material 242 and a portion of the second electrode 243. The first electrode 241 is disposed adjacent to or disposed on the first surface 201 of the die body 20, the piezoelectric material 242 is disposed on the first electrode 241, and the second electrode 243 is disposed on the piezoelectric material 242. That is, the piezoelectric material 242 is sandwiched between the first electrode 241 and the second electrode 243. As shown in FIG. 4, a size of a portion of the second electrode 243 in the transducing region 22 may be equal to the size of the piezoelectric material 242 (both are disposed within the transducing region 22), and another portion of the second electrode 243 extends to the first surface 201 of the die body 20 outside the transducing region 22 for electrical connection. In addition, the size of the first electrode 241 is greater than the size of the piezoelectric material 242. That is, a portion of the first electrode 241 is disposed outside the transducing region 22 for electrical connection.

Figure 5:
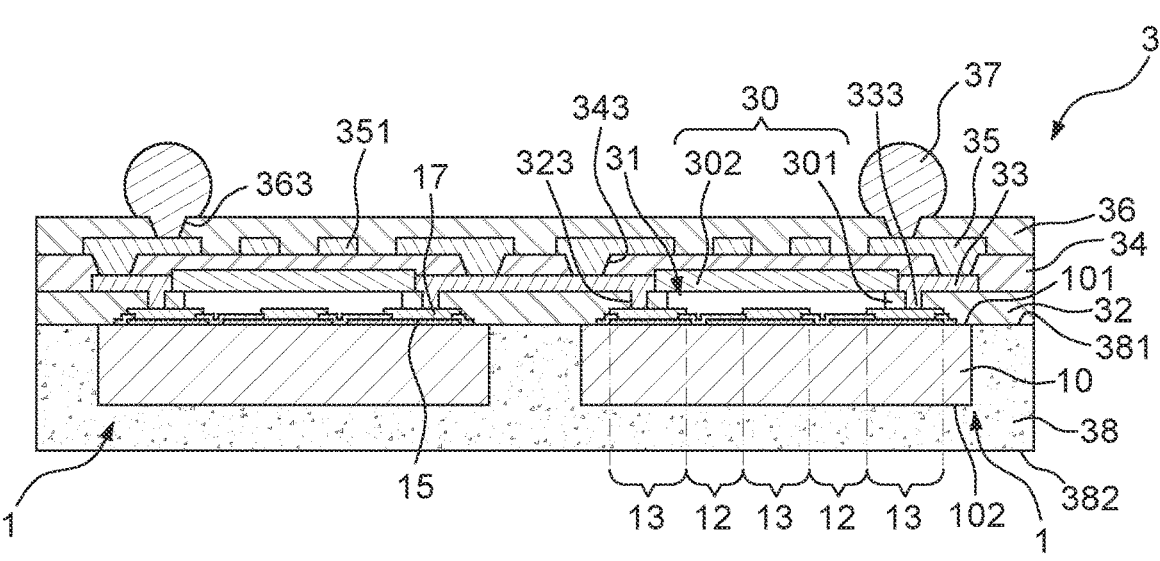
FIG. 5 illustrates a cross-sectional view of a package structure according to some embodiments of the present disclosure.
Figure 6:
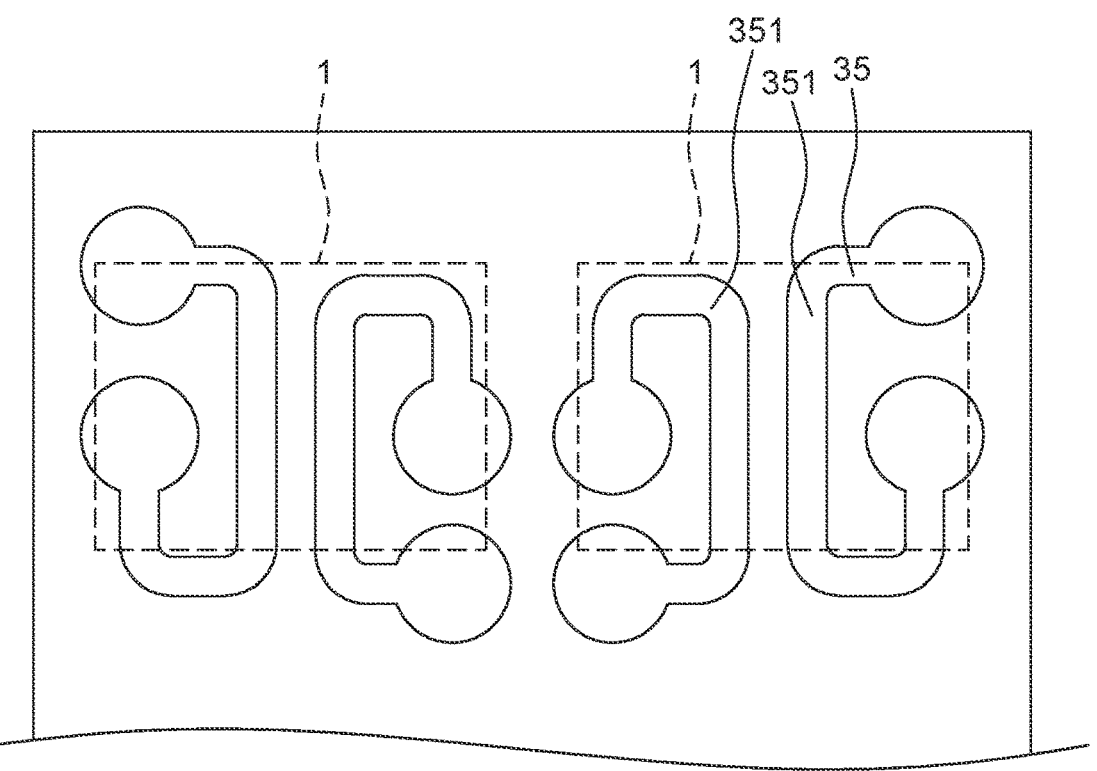
FIG. 6 illustrates a top view of a second redistribution layer (RDL) of a package structure according to some embodiments of the present disclosure.

FIG. 5 illustrates a cross-sectional view of a package structure 3 according to some embodiments of the present disclosure. FIG. 6 illustrates a top view of a second redistribution layer (RDL) 35 of the package structure 3 according to some embodiments of the present disclosure. The package structure 3 includes a plurality of transducer devices 1, a cap structure 30, a first insulating layer 32, a first redistribution layer (RDL) 33, a second insulating layer 34, a second redistribution layer (RDL) 35, a third insulating layer 36, a plurality of electrical connecting elements 37 and a protection material 38.

The transducer devices 1 are the surface acoustic wave (SAW) filters as shown in FIG. 1 to FIG. 3, and are disposed side by side. The protection material 38 covers the sidewall of the die body 10 of each of the transducer devices 1 and the second surface 102 of the die body 10 of each of the transducer devices 1. The protection material 38 and has a first surface 381 corresponding to the first surface 101 of the die body 10 and a second surface 382 corresponding to the second surface 102 of the die body 10. For example, the protection material 38 may include a molding compound with or without fillers. The first surface 381 of the protection material 38 may be substantially coplanar with the first surface 101 of the die body 10 of each of the transducer devices 1.

The first insulating layer 32 is disposed or formed on the first surface 381 of the protection material 38 and the first surface 101 of the die body 10 of each of the transducer devices 1. The first insulating layer 32 defines at least one opening 323 extending through the first insulating layer 32 to expose the conductive region 13 of the transducer device 1. A material of the first insulating layer 32 may be a polymer material, and may include an insulating material, a passivation material, a dielectric material or a solder resist material, such as, for example, a benzocyclobutene (BCB) based polymer or a polyimide (PI). In some embodiments, the first insulating layer 32 may include a cured photoimageable dielectric (PID) material, such as an epoxy or a PI including photoinitiators. In some embodiments, the first insulating layer 32 may be formed from a film type material. It is noted that the first insulating layer 32 may include a side wall portion 301 of the cap structure 30. That is, the first insulating layer 32 and the side wall portion 301 of the cap structure 30 may be the same layer.

The first redistribution layer (RDL) 33 may be a patterned circuit structure, and is disposed on the top surface of the first insulating layer 32 and in the opening 323 of the first insulating layer 32. A material of the first redistribution layer (RDL) 33 may include copper, and may be formed by, for example, plating. A portion of the first redistribution layer (RDL) 33 that is disposed in the opening 323 of the first insulating layer 32 forms an inner conductive via 333 to contact the conductive region 13 of the transducer device 1. That is, the first redistribution layer (RDL) 33 is electrically connected to the transducer devices 1 through the inner conductive vias 333. It is noted that the first redistribution layer (RDL) 33 may include a plurality of conductive traces and a plurality of bonding pads.

The cap structure 30 covers the transducing region 12 of the transducer device 1 to form an enclosed space 31. The cap structure 30 includes the side wall portion 301 and a roof portion 302. A material of the roof portion 302 may be the same as or different from the material of the first insulating layer 32. A material of the roof portion 302 may be a polymer material, and may include an insulating material, a passivation material, a dielectric material or a solder resist material, such as, for example, a benzocyclobutene (BCB) based polymer or a polyimide (PI). In some embodiments, the roof portion 302 may include a cured photoimageable dielectric (PID) material, such as an epoxy or a PI including photoinitiators. In some embodiments, the roof portion 302 may be formed from a film type material. The side wall portion 301 surrounds the transducing region 12, and the roof portion 302 covers the side wall portion 301 completely to form the enclosed space 31. Thus, there may be a boundary between the side wall portion 301 and the roof portion 302. In some embodiments, the enclosed space 31 may be a vacuum.

The second insulating layer 34 is formed or disposed to cover at least portions of the first insulating layer 32, the first redistribution layer (RDL) 33 and the roof portion 302. The second insulating layer 34 defines at least one opening 343 extending through the second insulating layer 34 to expose a portion of the first redistribution layer (RDL) 33. A material of the second insulating layer 34 may be the same as or different from the material of the first insulating layer 32. A material of the second insulating layer 34 may include an insulating material, a passivation material, a dielectric material or a solder resist material, such as, for example, a benzocyclobutene (BCB) based polymer or a polyimide (PI). In some embodiments, the second insulating layer 34 may include a cured photoimageable dielectric (PID) material, such as an epoxy or a PI including photoinitiators.

The second redistribution layer (RDL) 35 may be a patterned circuit structure, and is disposed on the top surface of the second insulating layer 34 and in the opening 343 of the second insulating layer 34 to contact or electrically connected to the exposed portion of the first redistribution layer (RDL) 33. A material of the second redistribution layer (RDL) 35 may include copper, and may be formed by, for example, plating. In some embodiments, as shown in FIG. 6, the second redistribution layer (RDL) 35 may include at least one integrated passive device (IPD) such as an inductor 351. It is noted that the first redistribution layer (RDL) 33 may also include the integrated passive device (IPD) such as an inductor. The inductor may be spiral or helical.

The third insulating layer 36 is formed or disposed to cover at least portions of the second insulating layer 34 and the second redistribution layer (RDL) 35. The third insulating layer 36 defines at least one opening 363 extending through the third insulating layer 36 to expose a portion of the second redistribution layer (RDL) 35. A material of the third insulating layer 36 may include an insulating material, a passivation material, a dielectric material or a solder resist material, such as, for example, a benzocyclobutene (BCB) based polymer or a polyimide (PI). In some embodiments, the third insulating layer 36 may include a cured photoimageable dielectric (PID) material, such as an epoxy or a PI including photoinitiators.

The electrical connecting element 37 (e.g., solder bump) is attached to and electrically connected to the second redistribution layer (RDL) 35 through the opening 363 for external connection.

In the package structure 3 illustrated in FIG. 5, the die body 10 of each of the transducer devices 1 is a bare die, thus, the size of the package structure 3 can be reduced. In addition, the cap structure 30 can protect the transducing region 12 of the transducer device 1. Further, the integrated passive device (IPD) of the second redistribution layer (RDL) 35 and the first redistribution layer (RDL) 33 can achieve the effect of matching and tuning.

Figure 7:
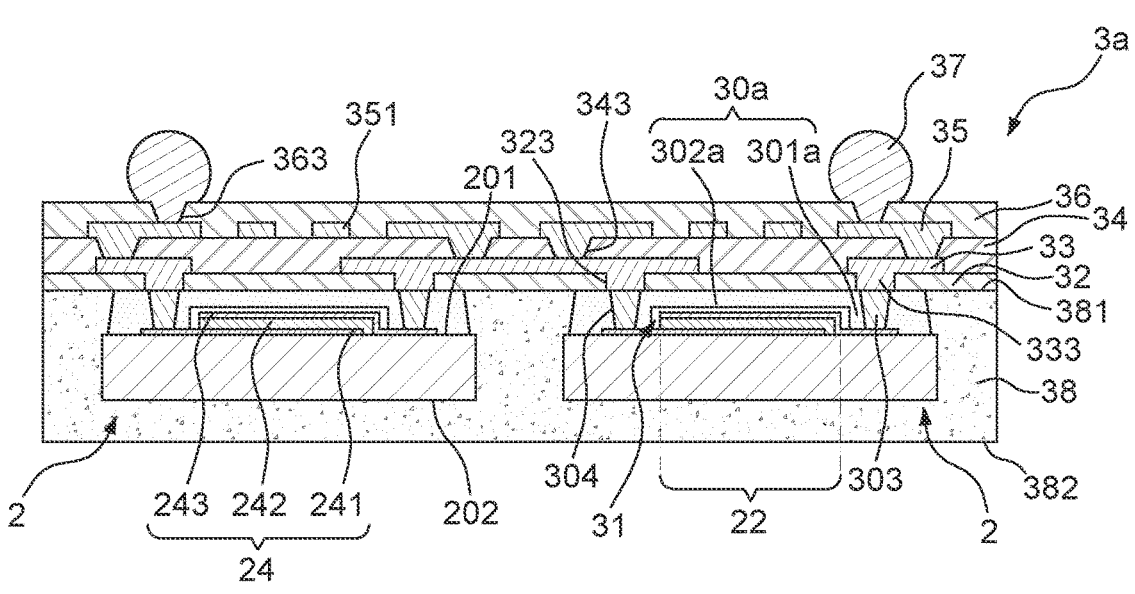
FIG. 7 illustrates a cross-sectional view of a package structure according to some embodiments of the present disclosure.

FIG. 7 illustrates a cross-sectional view of a package structure 3a according to some embodiments of the present disclosure. The package structure 3a includes a plurality of transducer devices 2, a plurality of cap structures 30a, a plurality of periphery conductive vias 303, a first insulating layer 32, a first redistribution layer (RDL) 33, a second insulating layer 34, a second redistribution layer (RDL) 35, a third insulating layer 36, a plurality of electrical connecting elements 37 and a protection material 38.

The transducer devices 2 are the bulk acoustic wave (BAW) filters as shown in FIG. 4, and are disposed side by side. The cap structure 30a covers the transducing region 22 of the transducer device 2 to form an enclosed space 31. The cap structure 30a may be a monolithic structure, and may include a side wall portion 301a and a roof portion 302a. A material of the cap structure 30a may be a polymer material, and may include an insulating material, a passivation material, a dielectric material or a solder resist material, such as, for example, a benzocyclobutene (BCB) based polymer or a polyimide (PI). In some embodiments, the roof portion 302 may include a cured photoimageable dielectric (PID) material, such as an epoxy or a PI including photoinitiators. The side wall portion 301a defines a plurality of openings 304 to expose a portion of the first electrode 241 and a portion of the second electrode 243. The periphery conductive vias 303 are disposed in the openings 304 to contact and electrically connect the exposed portion of the first electrode 241 and the exposed portion of the second electrode 243. As shown in FIG. 7, the top surface of the cap structure 30a is substantially coplanar with the top ends of the periphery conductive vias 303.

The protection material 38 covers the sidewall of the die body 20 of each of the transducer devices 2, the second surface 202 of the die body 20 of each of the transducer devices 2 and the side surface of the cap structure 30a. The first surface 381 of the protection material 38 may be substantially coplanar with the top surface of the cap structure 30a and the top ends of the periphery conductive vias 303.

The first insulating layer 32, the first redistribution layer (RDL) 33, the second insulating layer 34, the second redistribution layer (RDL) 35, the third insulating layer 36 and the electrical connecting elements 37 are substantially similar to the first insulating layer 32, the first redistribution layer (RDL) 33, the second insulating layer 34, the second redistribution layer (RDL) 35, the third insulating layer 36 and the electrical connecting elements 37 of FIG. 5, respectively. As shown in FIG. 7, the first insulating layer 32 is disposed or formed on the first surface 381 of the protection material 38 and the top surface of the cap structure 30a. In addition, the inner conductive via 333 contacts or electrically connects the periphery conductive vias 303.

Figure 8:
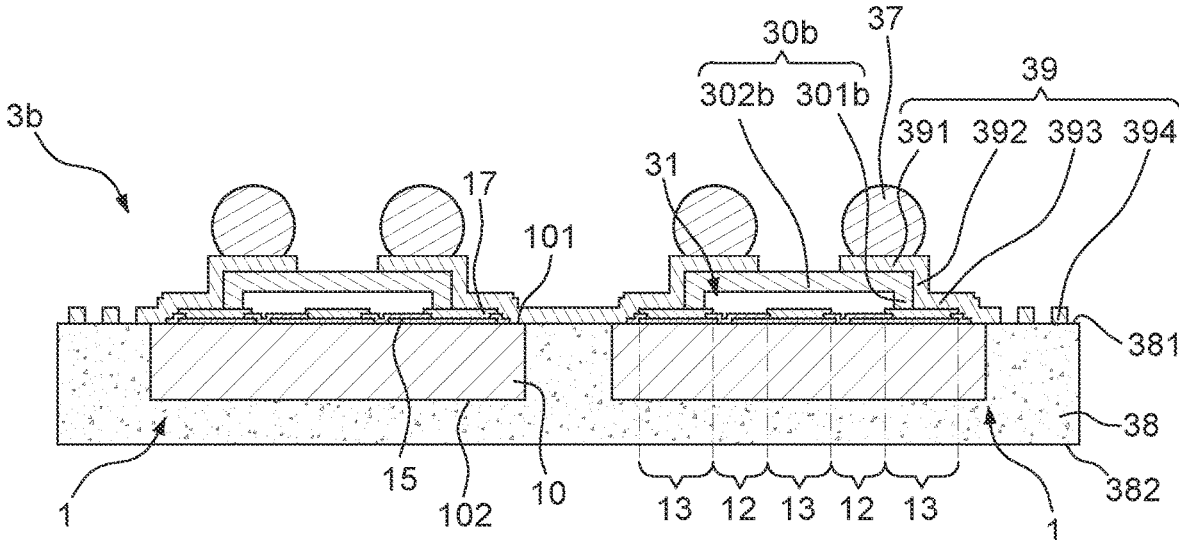
FIG. 8 illustrates a cross-sectional view of a package structure according to some embodiments of the present disclosure.

FIG. 8 illustrates a cross-sectional view of a package structure 3b according to some embodiments of the present disclosure. The package structure 3b includes a plurality of transducer devices 1, a plurality of cap structures 30b, a bottom redistribution layer (RDL) 39, a plurality of electrical connecting elements 37 and a protection material 38.

The transducer devices 1 are the surface acoustic wave (SAW) filters as shown in FIG. 1 to FIG. 3, and are disposed side by side. The protection material 38 covers the sidewall of the die body 10 of each of the transducer devices 1 and the second surface 102 of the die body 10 of each of the transducer devices 1. The protection material 38 and has a first surface 381 corresponding to the first surface 101 of the die body 10 and a second surface 382 corresponding to the second surface 102 of the die body 10. For example, the first surface 381 of the protection material 38 may be substantially coplanar with the first surface 101 of the die body 10 of each of the transducer devices 1.

The cap structure 30b covers the transducing region 12 of the transducer device 1 to form an enclosed space 31. The cap structure 30b may be a monolithic structure, and may include a side wall portion 301b and a roof portion 302b. Alternatively, the cap structure 30b may be the same as the cap structure 30 of FIG. 5. A material of the cap structure 30b may include polymer material, ceramic, glass, metal or semiconductor material.

The bottom redistribution layer (RDL) 39 may electrically connect the transducer devices 1, and may include a first portion 391, a second portion 392, a third portion 393 and a fourth portion 394. The first portion 391 is disposed on and contacts the roof portion 302b. The second portion 392 is disposed on and contacts the side wall portion 301b. The third portion 393 is disposed on and contacts the conductive region 13 of the transducer device 1. The fourth portion 394 is disposed on and contacts the first surface 381 of the protection material 38. The fourth portion 394 may include the integrated passive device (IPD) such as an inductor. The electrical connecting elements 37 are disposed on the first portion 391.

Figure 9:
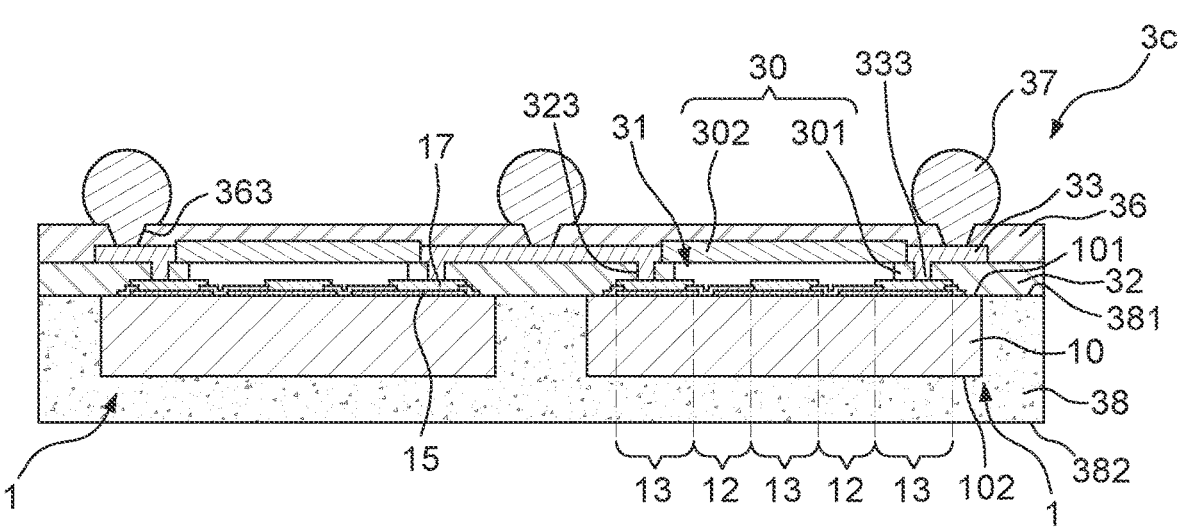
FIG. 9 illustrates a cross-sectional view of a package structure according to some embodiments of the present disclosure.

FIG. 9 illustrates a cross-sectional view of a package structure 3c according to some embodiments of the present disclosure. The package structure 3c of FIG. 9 may be similar to the package structure 3 of FIG. 5 except that the second insulating layer 34 and the second redistribution layer (RDL) 35 are omitted.

Figure 10:
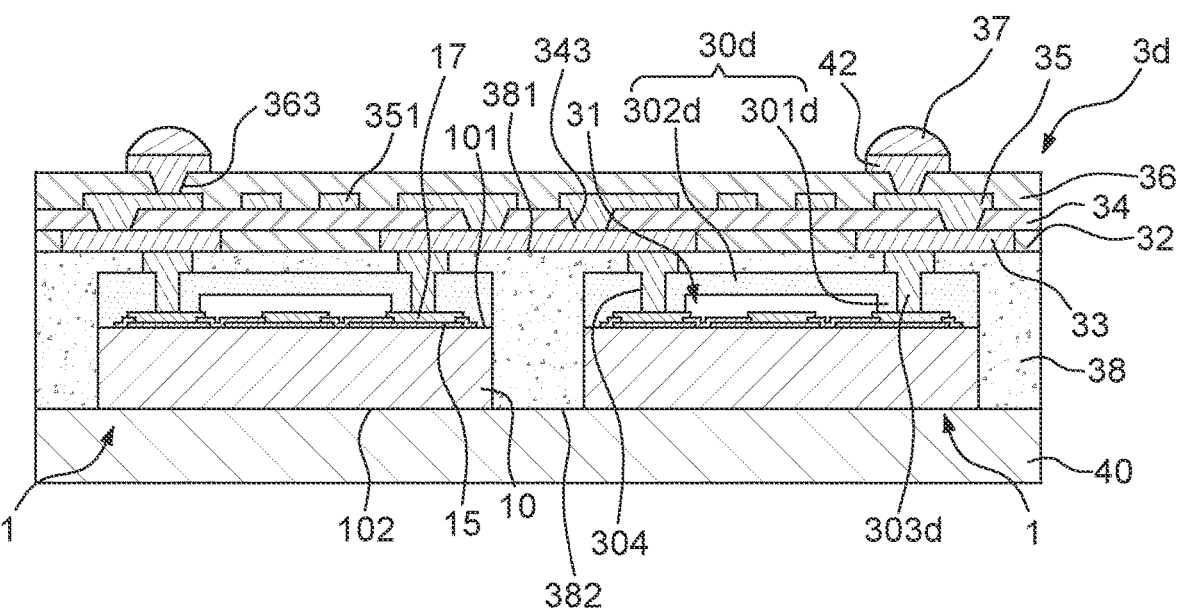
FIG. 10 illustrates a cross-sectional view of a package structure according to some embodiments of the present disclosure.

FIG. 10 illustrates a cross-sectional view of a package structure 3d according to some embodiments of the present disclosure. The package structure 3d includes a plurality of transducer devices 1, a plurality of cap structures 30d, a plurality of periphery conductive vias 303d, a first insulating layer 32, a first redistribution layer (RDL) 33, a second insulating layer 34, a second redistribution layer (RDL) 35, a third insulating layer 36, a plurality of electrical connecting elements 37, a third redistribution layer (RDL) 42, a carrier 40 and a protection material 38.

The transducer devices 1 are the surface acoustic wave (SAW) filters as shown in FIG. 1 to FIG. 3, and are disposed side by side. The cap structure 30d covers the transducing region 12 of the transducer device 1 to form an enclosed space 31. The cap structure 30d may be a monolithic structure, and may include a side wall portion 301d and a roof portion 302d. Alternatively, the cap structure 30d may be the same as the cap structure 30 of FIG. 5. A material of the cap structure 30d may include polymer material, ceramic, glass, metal or semiconductor material. The side wall portion 301d defines a plurality of openings 304 to expose a portion of the conductive region 13 of the transducer device 1. The periphery conductive vias 303d are disposed in the openings 304 to contact and electrically connect the exposed portion of the conductive region 13 of the transducer device 1. As shown in FIG. 10, the top ends of the periphery conductive vias 303*d* protrude from the roof portion 302*d*.

The transducer device 1 and the protection material 38 are disposed on the carrier 40. The second surfaces 102 of the transducer devices 1 and the second surface 382 of the protection material 38 are attached to a surface of the carrier 40. The protection material 38 covers the sidewall of the die body 10 of each of the transducer devices 1 and the cap structure 30*d*. The first surface 381 of the protection material 38 may be substantially coplanar with the top surface of the periphery conductive vias 303*d*.

The first insulating layer 32, the first redistribution layer (RDL) 33, the second insulating layer 34, the second redistribution layer (RDL) 35, the third insulating layer 36 and the electrical connecting elements 37 are substantially similar to the first insulating layer 32, the first redistribution layer (RDL) 33, the second insulating layer 34, the second redistribution layer (RDL) 35, the third insulating layer 36 and the electrical connecting elements 37 of FIG. 5, respectively. As shown in FIG. 10, the thickness of the first insulating layer 32 is substantially equal to the thickness of the first redistribution layer (RDL) 33. The third redistribution layer (RDL) 42 may be a patterned circuit structure, and is disposed on the top surface of the third insulating layer 36 and in the opening 363 of the third insulating layer 36 to contact or electrically connected to portions of the second redistribution layer (RDL) 35. A material of the third redistribution layer (RDL) 42 may include copper, and may be formed by, for example, plating. The electrical connecting elements 37 are disposed on the third redistribution layer (RDL) 42.

Figure 11:
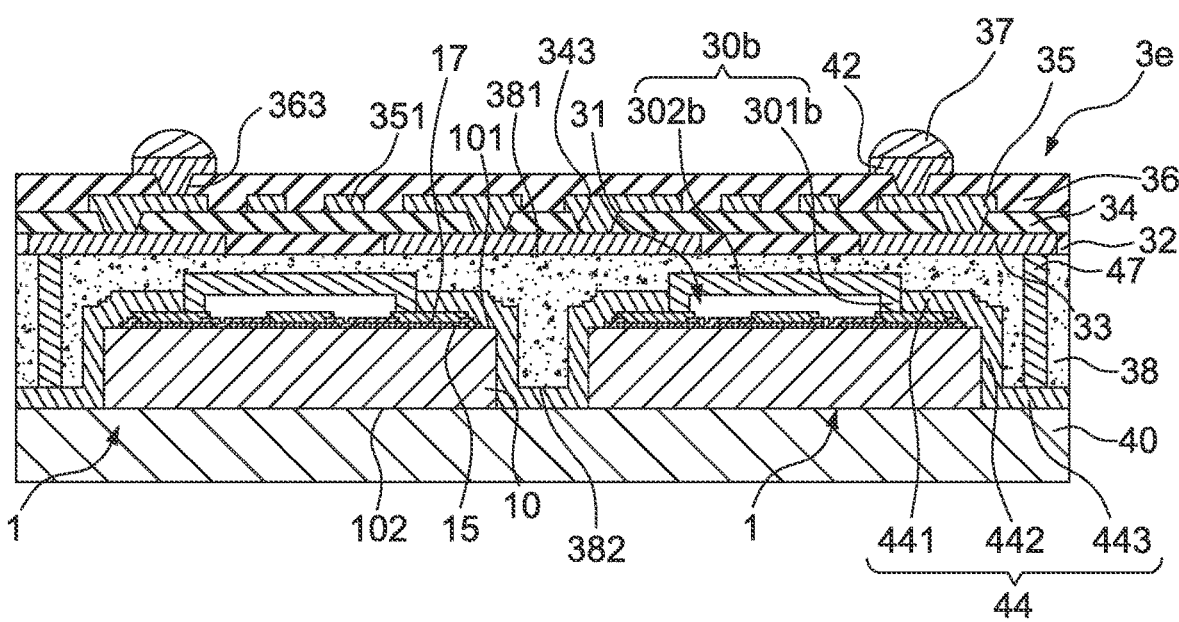
FIG. 11 illustrates a cross-sectional view of a package structure according to some embodiments of the present disclosure.

FIG. 11 illustrates a cross-sectional view of a package structure 3*e* according to some embodiments of the present disclosure. The package structure 3*e* of FIG. 11 may be similar to the package structure 3*d* of FIG. 10 except that the periphery conductive vias 303*d* are omitted, and a bottom redistribution layer (RDL) 44 and a plurality of outer conductive vias 46 are further included. In addition, the cap structure 30*d* of FIG. 10 may be replaced by the cap structure 30*b* of FIG. 8. The bottom redistribution layer (RDL) 44 may electrically connect the transducer devices 1, and may include a first portion 441, a second portion 442, and a third portion 443. The first portion 441 is disposed on and contacts the conductive region 13 of the transducer device 1. The second portion 442 is disposed on and contacts the side surface of the die body 10 of the transducer device 1. The third portion 443 is disposed on and contacts the surface of the carrier 40. The outer conductive vias 46 extend through the protection material 38, and electrically connect and contact the third portion 443 and the first redistribution layer (RDL) 33.

Figure 12:
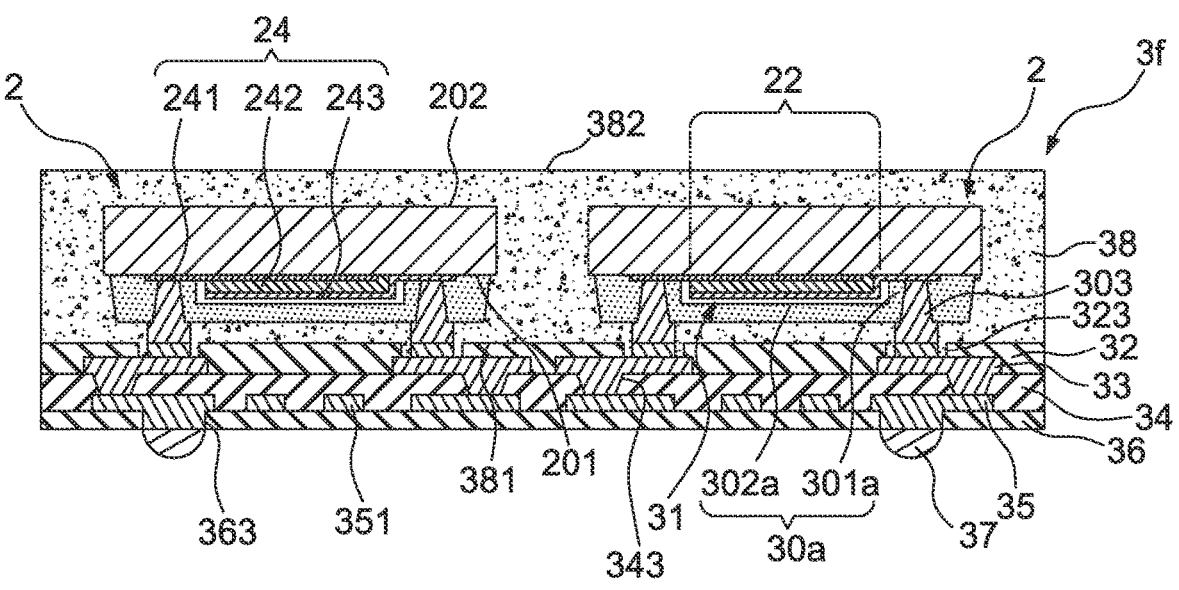
FIG. 12 illustrates a cross-sectional view of a package structure according to some embodiments of the present disclosure.

FIG. 12 illustrates a cross-sectional view of a package structure 3*f* according to some embodiments of the present disclosure. The package structure 3*f* of FIG. 12 may be similar to the package structure 3*a* of FIG. 7, and the differences therebetween are described as follows. The periphery conductive vias 303 protrude from the roof portion 302*a*. The first redistribution layer (RDL) 33 is embedded in the first insulating layer 32 and disposed on the second insulating layer 34 and in the opening 343 of the second insulating layer 34. The second redistribution layer (RDL) 35 is embedded in the second insulating layer 34 and disposed on the third insulating layer 36 and in the opening 363 of the third insulating layer 36. The electrical connecting elements 37 are disposed on the exposed portions of the second redistribution layer (RDL) 35.

Figure 13:
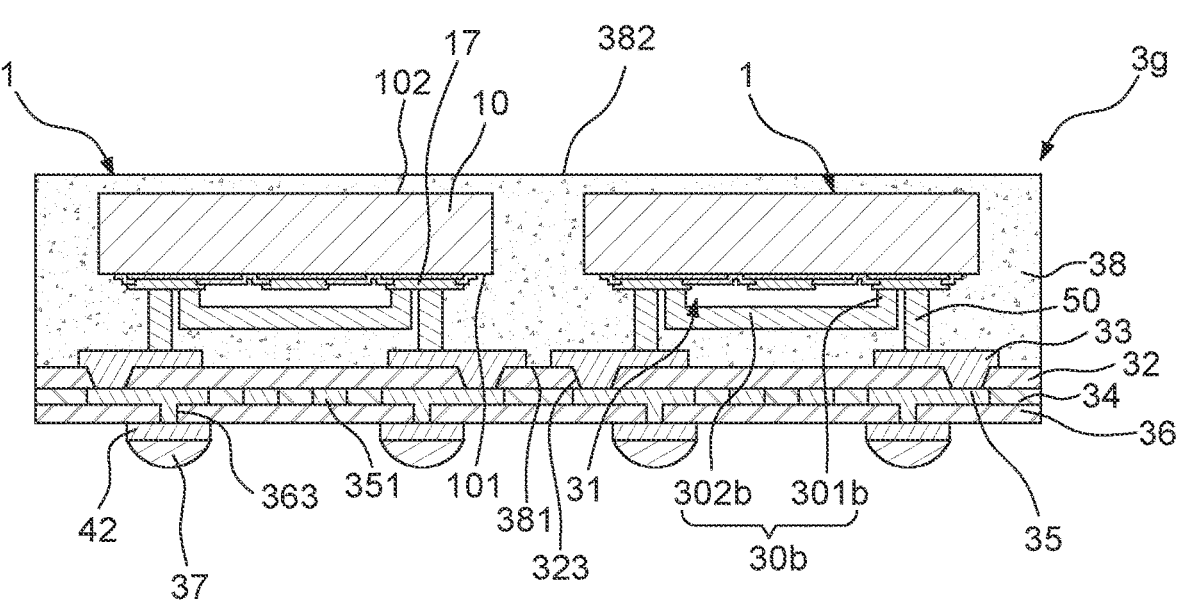
FIG. 13 illustrates a cross-sectional view of a package structure according to some embodiments of the present disclosure.

FIG. 13 illustrates a cross-sectional view of a package structure 3*g* according to some embodiments of the present disclosure. The package structure 3*g* of FIG. 13 may be similar to the package structure 3*f* of FIG. 12, and the differences therebetween are described as follows. The periphery conductive vias 303 of FIG. 12 are omitted, and the cap structures 30*a* of FIG. 12 are replaced by the cap structures 30*b*. The package structure 3*g* of FIG. 13 further includes a plurality of conductive pillars 50 disposed outside the cap structure 30*b* and surround the cap structure 30*b*. The first redistribution layer (RDL) 33 is electrically connected to the conductive regions 13 of the transducer devices 1 through the conductive pillars 50.

Figure 14:
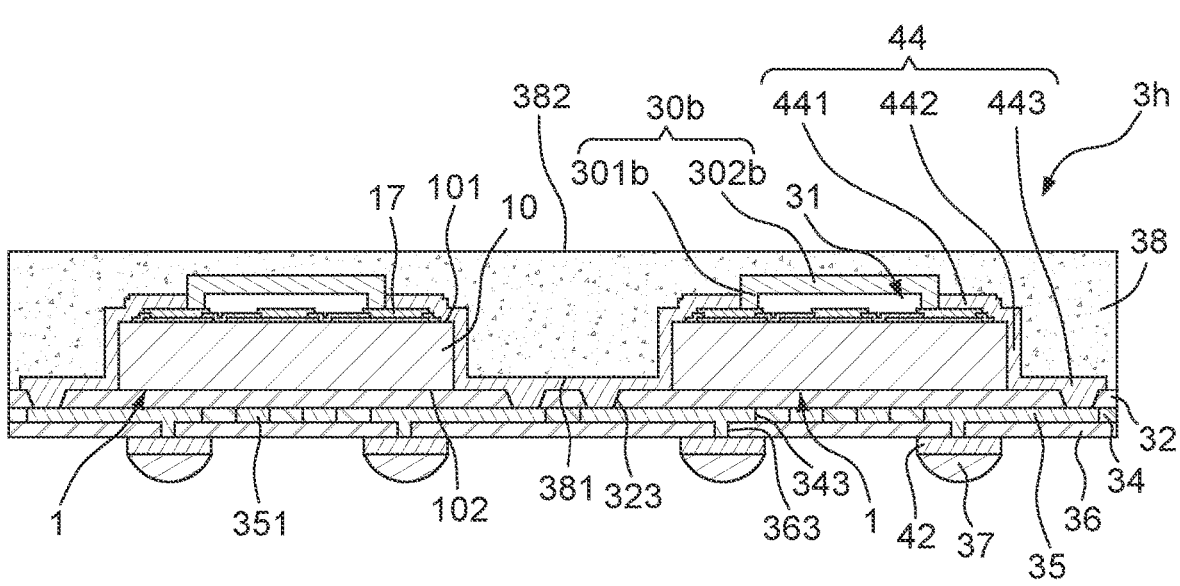
FIG. 14 illustrates a cross-sectional view of a package structure according to some embodiments of the present disclosure.

FIG. 14 illustrates a cross-sectional view of a package structure 3*h* according to some embodiments of the present disclosure. The package structure 3*h* of FIG. 14 may be similar to the package structure 3*e* of FIG. 11, and the differences therebetween are described as follows. The first insulating layer 32, the second insulating layer 34, the second redistribution layer (RDL) 35, the third insulating layer 36 and the electrical connecting elements 37 are disposed under the transducer devices 1. That is, the second surfaces of the transducer devices 1 are attached or adhered to the first insulating layer 32. In addition, the first redistribution layer (RDL) 33 of FIG. 11 is omitted. The third portion 443 of the bottom redistribution layer (RDL) 44 is electrically connected to the second redistribution layer (RDL) 35 through the opening 323 of the first insulating layer 32.

FIG. 15 through FIG. 21 illustrate an example of a method for manufacturing a package structure according to some embodiments of the present disclosure. In some embodiments, the method is for manufacturing a package structure such as the package structure 3 shown in FIG. 5.

Figure 15:
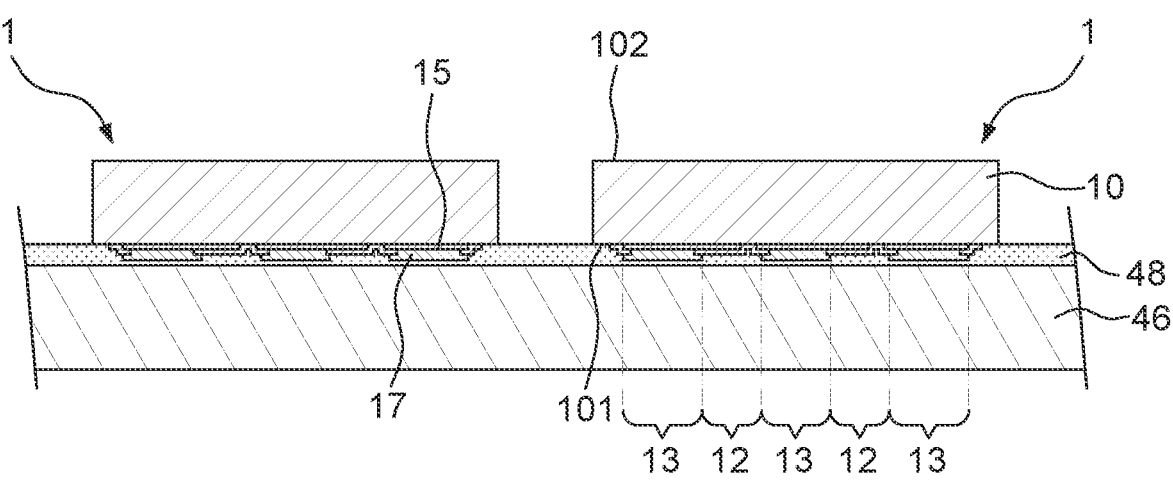
FIG. 15 illustrates one or more stages of an example of a method for manufacturing a package structure according to some embodiments of the present disclosure.

Referring to FIG. 15, a plurality of transducer devices 1 are disposed on or are adhered to a carrier 46 side by side through an adhesion layer 48 (or a release layer). The first surface 101 of the die body 10 faces the carrier 46, and the first metal layer 15 and the second metal layer 17 are embedded in the adhesion layer 48.

Figure 16:
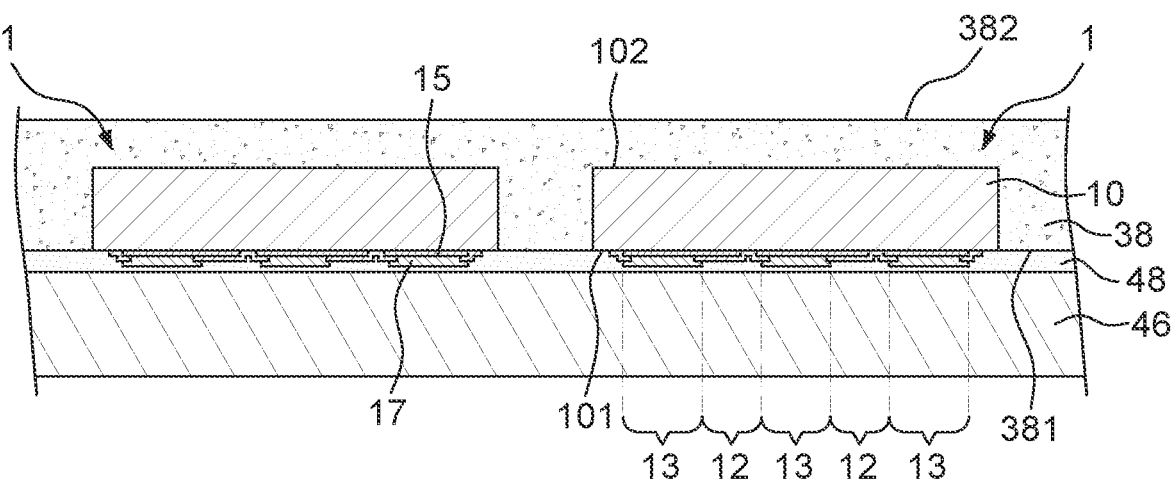
FIG. 16 illustrates one or more stages of an example of a method for manufacturing a package structure according to some embodiments of the present disclosure.

Referring to FIG. 16, the protection material 38 is formed or disposed on the adhesion layer 48 to cover the transducer devices 1. The protection material 38 has a first surface 381 contacting the adhesion layer 48 and a second surface 382 opposite to the first surface 381.

Figure 17:
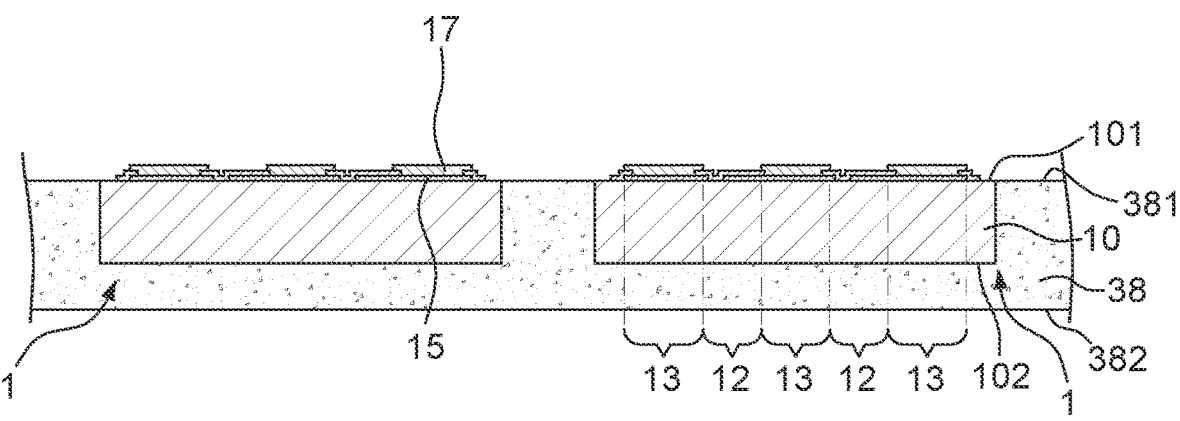
FIG. 17 illustrates one or more stages of an example of a method for manufacturing a package structure according to some embodiments of the present disclosure.

Referring to FIG. 17, the carrier 46 and the adhesion layer 48 are removed.

Figure 18:
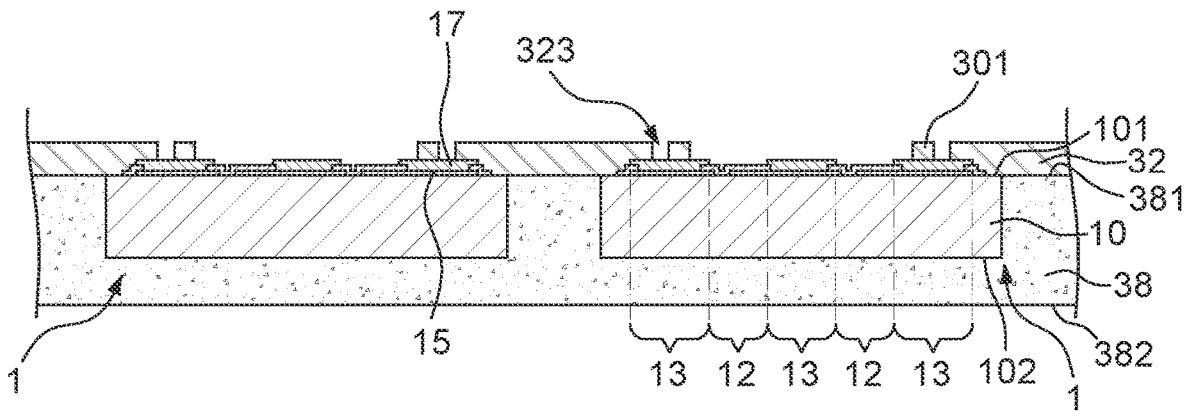
FIG. 18 illustrates one or more stages of an example of a method for manufacturing a package structure according to some embodiments of the present disclosure.

Referring to FIG. 18, the first insulating layer 32 is disposed or formed on the first surface 381 of the protection material 38 and the first surface 101 of the die body 10 of each of the transducer devices 1. The first insulating layer 32 defines at least one opening 323 extending through the first insulating layer 32 to expose the conductive region 13 of the transducer device 1. It is noted that the first insulating layer 32 may include a side wall portion 301 to expose the transducing region 12 of the transducer device 1. The side wall portion 301 surrounds the transducing region 12 to form a cavity.

Figure 19:
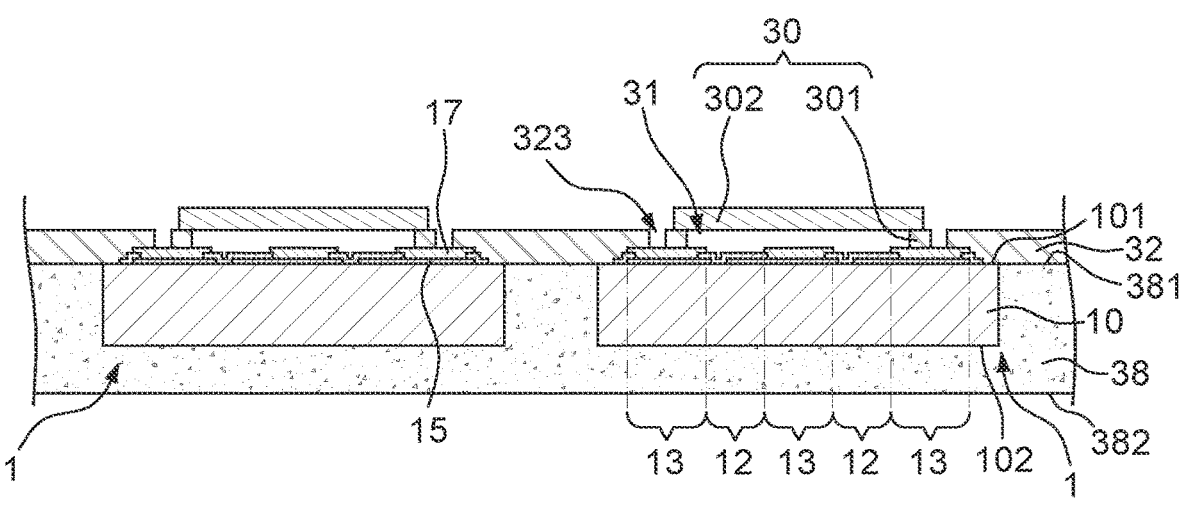
FIG. 19 illustrates one or more stages of an example of a method for manufacturing a package structure according to some embodiments of the present disclosure.

Referring to FIG. 19, a roof portion 302 is formed or disposed on the side wall portion 301 to cover the side wall portion 301 and the cavity completely to form the cap structure 30 so as to cover the transducing region 12 of the transducer device 1 to form an enclosed space 31. Thus, there may be a boundary between the side wall portion 301 and the roof portion 302. In some embodiments, the enclosed space 31 may be a vacuum.

Figure 20:
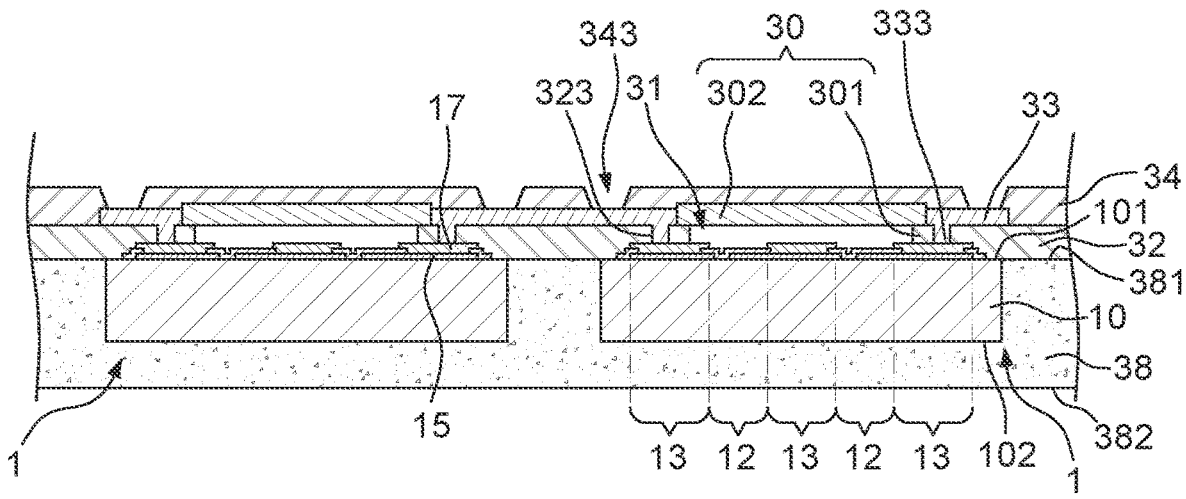
FIG. 20 illustrates one or more stages of an example of a method for manufacturing a package structure according to some embodiments of the present disclosure.

Referring to FIG. 20, the first redistribution layer (RDL) 33 is formed or disposed on the top surface of the first insulating layer 32 and in the opening 323 of the first insulating layer 32. A portion of the first redistribution layer (RDL) 33 that is disposed in the opening 323 of the first insulating layer 32 forms the inner conductive via 333 to contact the conductive region 13 of the transducer device 1. That is, the first redistribution layer (RDL) 33 is electrically connected to the transducer devices 1 through the inner conductive vias 333. It is noted that the first redistribution layer (RDL) 33 may include a plurality of conductive traces, a plurality of bonding pads and a plurality of inductors. Then, the second insulating layer 34 is formed or disposed to cover at least portions of the first insulating layer 32, the first redistribution layer (RDL) 33 and the roof portion 302. The second insulating layer 34 defines at least one opening 343 extending through the second insulating layer 34 to expose a portion of the first redistribution layer (RDL) 33.

Figure 21:
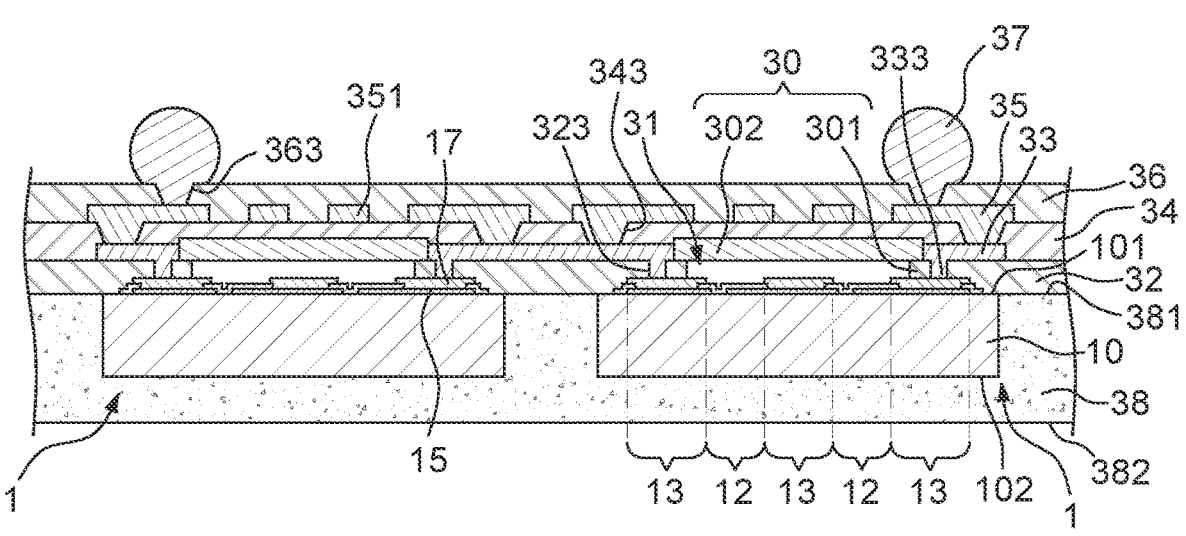
FIG. 21 illustrates one or more stages of an example of a method for manufacturing a package structure according to some embodiments of the present disclosure.

Referring to FIG. 21, the second redistribution layer (RDL) 35 is disposed on the top surface of the second insulating layer 34 and in the opening 343 of the second insulating layer 34 to contact or electrically connected to the exposed portion of the first redistribution layer (RDL) 33. In some embodiments, the second redistribution layer (RDL) 35 may include at least one integrated passive device (IPD) such as an inductor 351. Then, the third insulating layer 36 is formed or disposed to cover at least portions of the second insulating layer 34 and the second redistribution layer (RDL) 35. The third insulating layer 36 defines at least one opening 363 extending through the third insulating layer 36 to expose a portion of the second redistribution layer (RDL) 35. Then, the electrical connecting element 37 (e.g., solder bump) is attached to and electrically connected to the second redistribution layer (RDL) 35 through the opening 363 for external connection. Then, a singulation process is conducted to obtain the package structure 3 of FIG. 5.

FIG. 22 through FIG. 31 illustrate an example of a method for manufacturing a package structure according to some embodiments of the present disclosure. In some embodiments, the method is for manufacturing a package structure such as the package structure 3a shown in FIG. 7.

Figure 22:
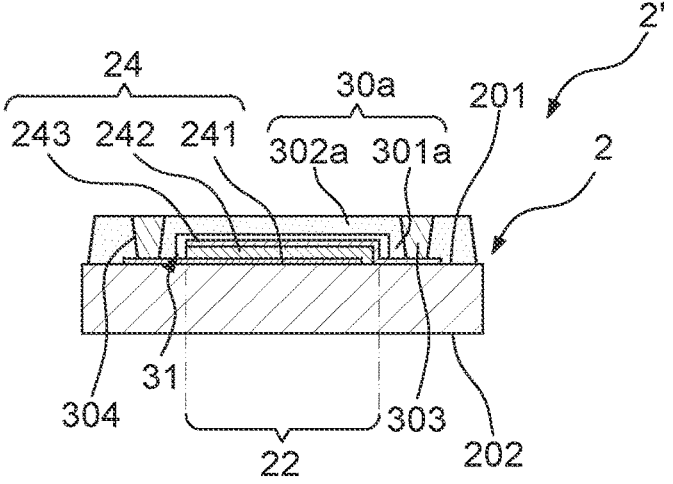
FIG. 22 illustrates one or more stages of an example of a method for manufacturing a package structure according to some embodiments of the present disclosure.

Referring to FIG. 22, a plurality of units 2' are provided. The units 2' includes the transducer devices 2 (the bulk acoustic wave (BAW) filters as shown in FIG. 4), the cap structure 30a covering the transducing region 22 of the transducer device 2 and the periphery conductive vias 303 disposed in the openings 304 of the side wall portion 301a to contact and electrically connect the first electrode 241 and the second electrode 243.

Figure 23:
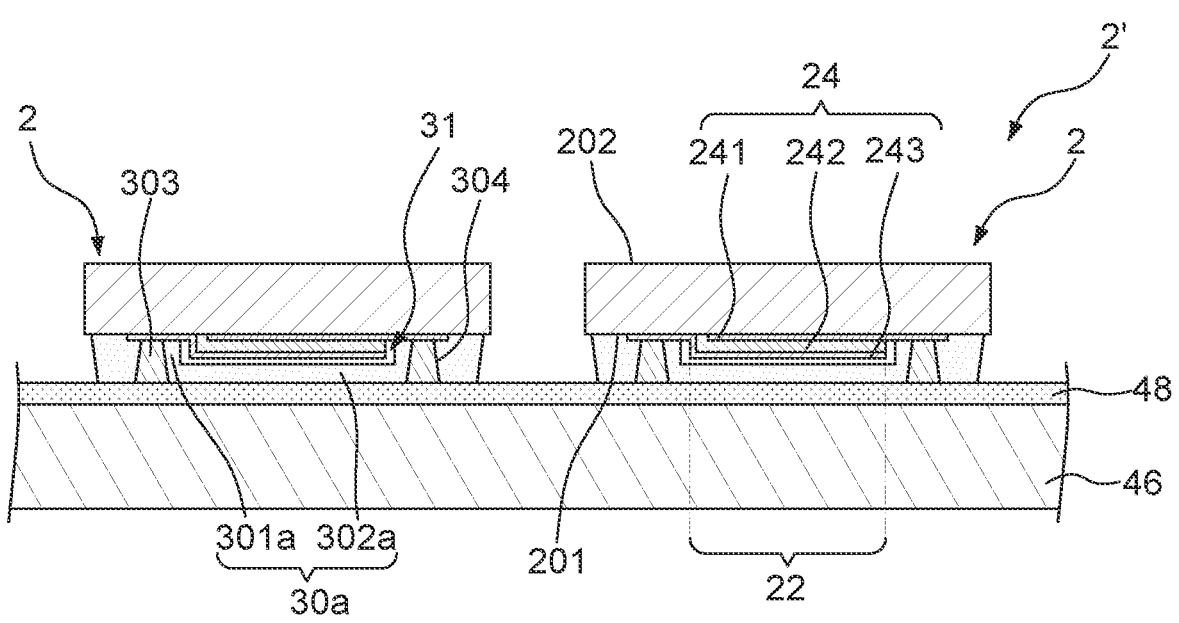
FIG. 23 illustrates one or more stages of an example of a method for manufacturing a package structure according to some embodiments of the present disclosure.

Referring to FIG. 23, the units 2' are disposed on or are adhered to a carrier 46 side by side through an adhesion layer 48. The first surface 201 of the die body 20 of the transducer device 2 faces the carrier 46, and the cap structure 30a contacts the adhesion layer 48.

Figure 24:
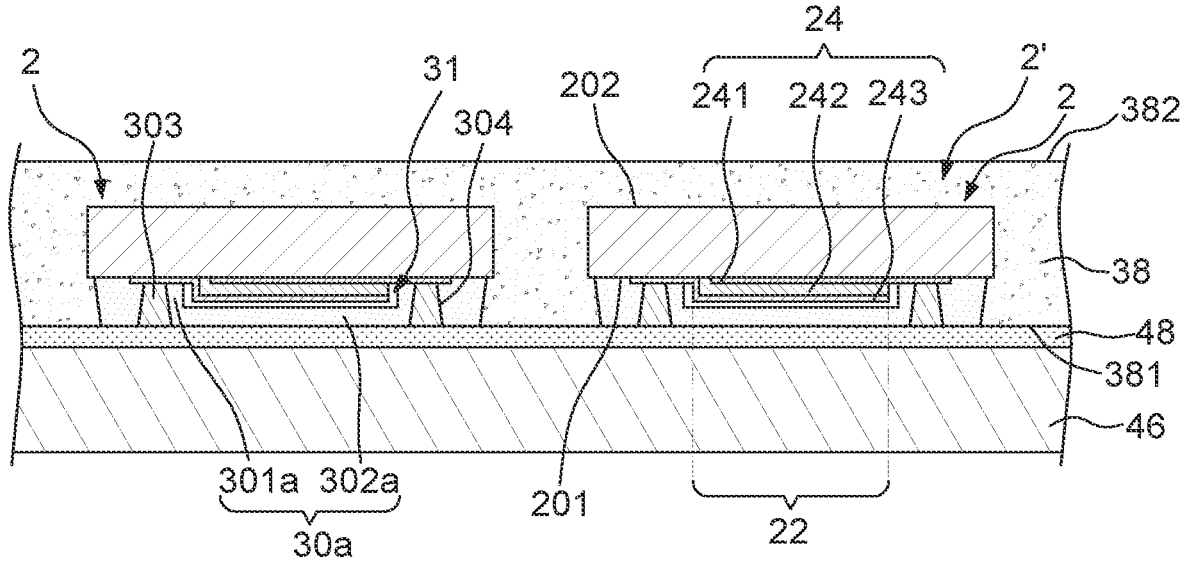
FIG. 24 illustrates one or more stages of an example of a method for manufacturing a package structure according to some embodiments of the present disclosure.

Referring to FIG. 24, the protection material 38 is formed or disposed on the adhesion layer 48 to cover the units 2'. The protection material 38 has a first surface 381 contacting the adhesion layer 48 and a second surface 382 opposite to the first surface 381.

Figure 25:
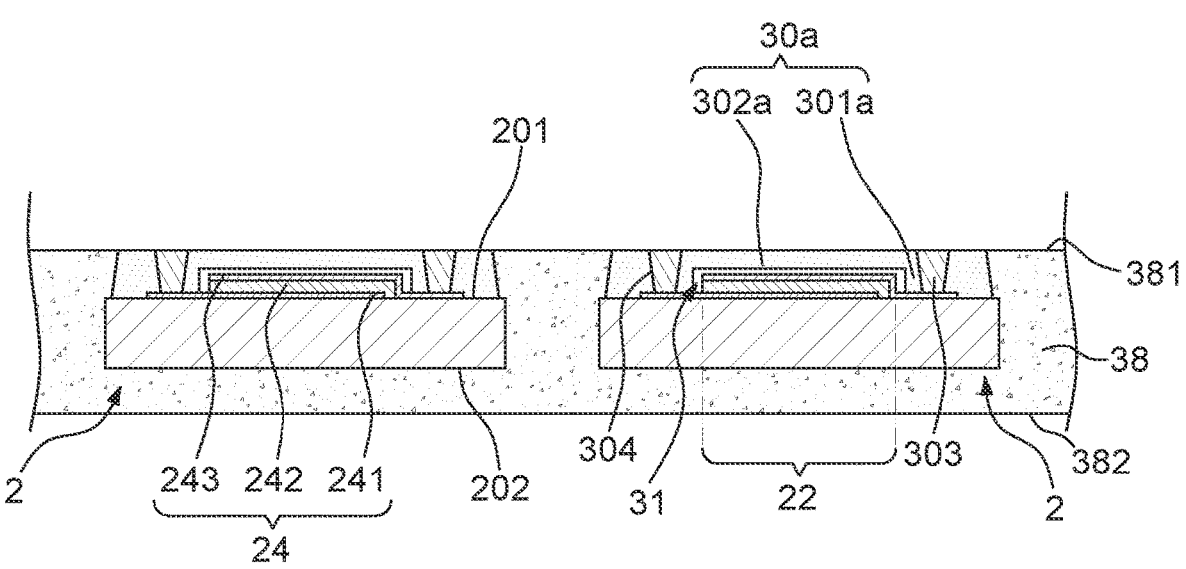
FIG. 25 illustrates one or more stages of an example of a method for manufacturing a package structure according to some embodiments of the present disclosure.

Referring to FIG. 25, the carrier 46 and the adhesion layer 48 are removed.

Figure 26:
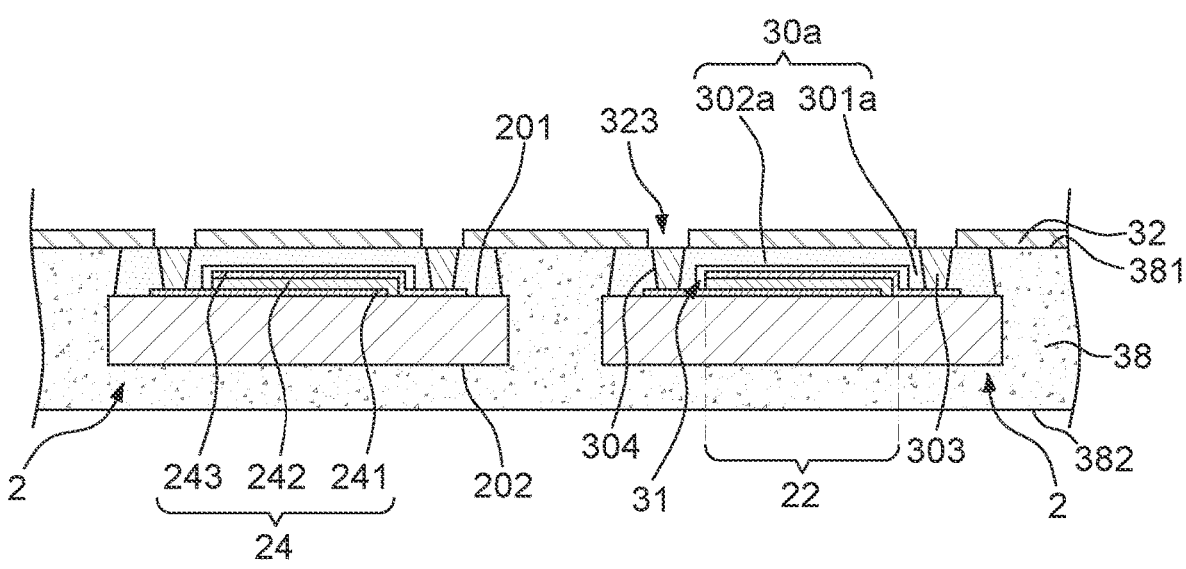
FIG. 26 illustrates one or more stages of an example of a method for manufacturing a package structure according to some embodiments of the present disclosure.

Referring to FIG. 26, the first insulating layer 32 is disposed or formed on the first surface 381 of the protection material 38 and the top surfaces of the cap structures 30a. The first insulating layer 32 defines at least one opening 323 extending through the first insulating layer 32 to expose the periphery conductive via 303.

Figure 27:
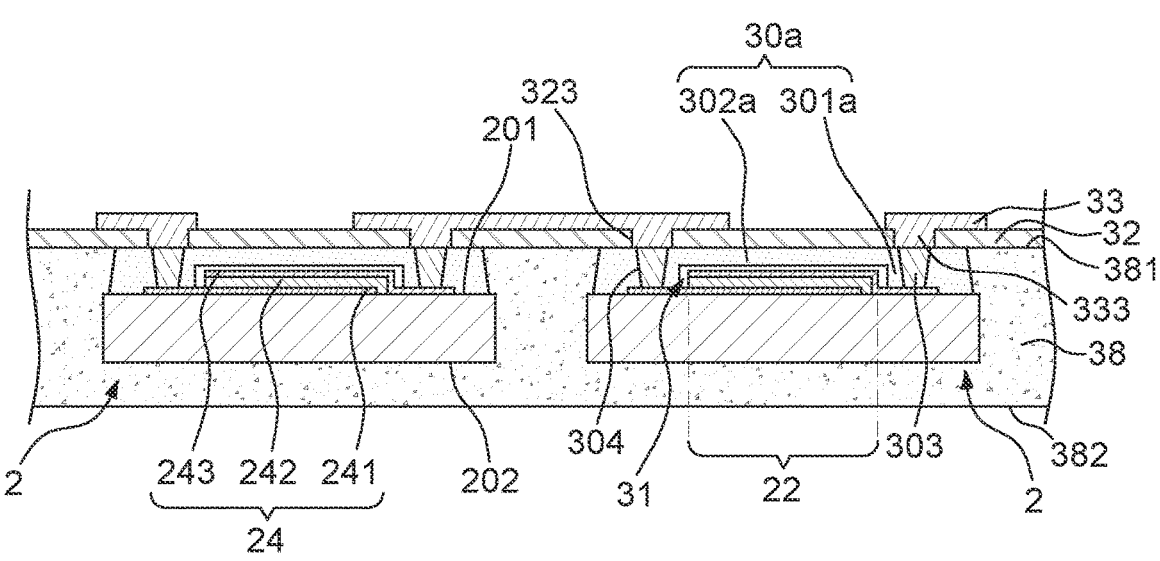
FIG. 27 illustrates one or more stages of an example of a method for manufacturing a package structure according to some embodiments of the present disclosure.

Referring to FIG. 27, the first redistribution layer (RDL) 33 is formed or disposed on the top surface of the first insulating layer 32 and in the opening 323 of the first insulating layer 32. A portion of the first redistribution layer (RDL) 33 that is disposed in the opening 323 of the first insulating layer 32 forms the inner conductive via 333 to contact the periphery conductive via 303.

Figure 28:
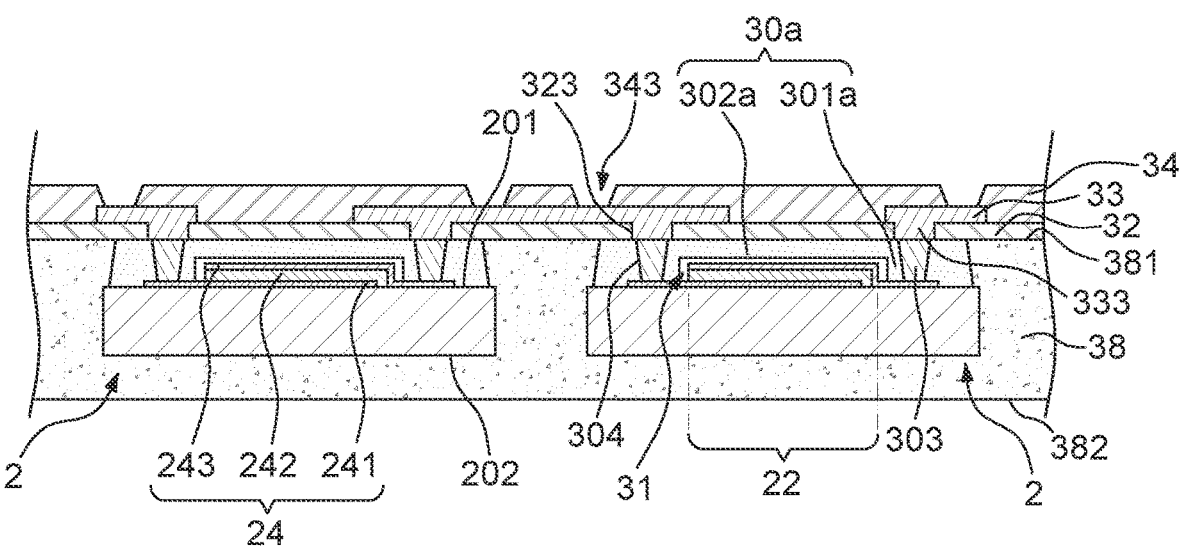
FIG. 28 illustrates one or more stages of an example of a method for manufacturing a package structure according to some embodiments of the present disclosure.

Referring to FIG. 28, the second insulating layer 34 is formed or disposed to cover at least portions of the first insulating layer 32 and the first redistribution layer (RDL) 33. The second insulating layer 34 defines at least one opening 343 extending through the second insulating layer 34 to expose a portion of the first redistribution layer (RDL) 33.

Figure 29:
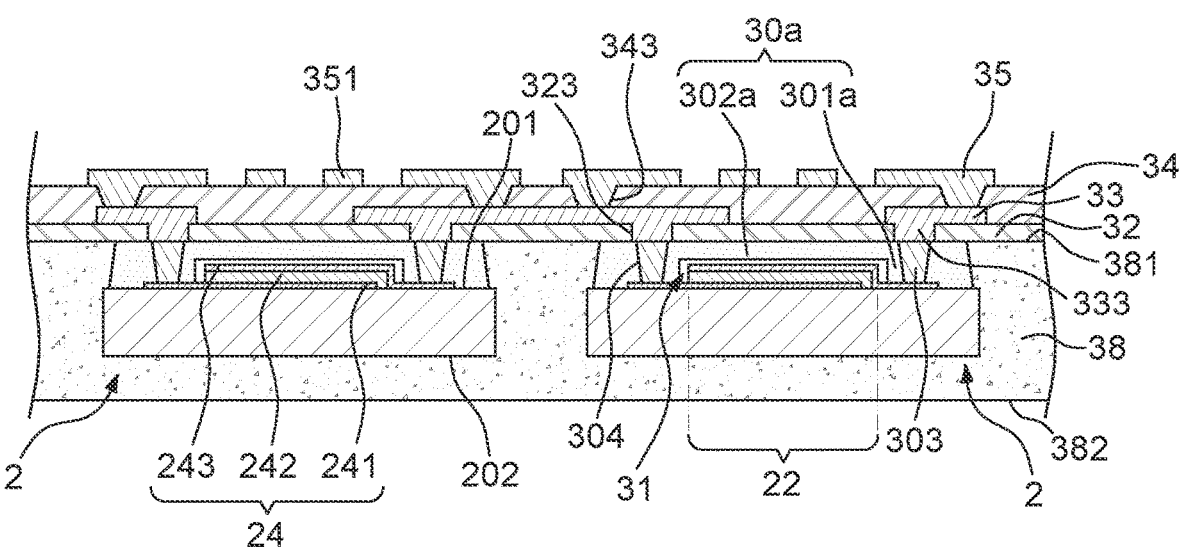
FIG. 29 illustrates one or more stages of an example of a method for manufacturing a package structure according to some embodiments of the present disclosure.

Referring to FIG. 29, the second redistribution layer (RDL) 35 is disposed on the top surface of the second insulating layer 34 and in the opening 343 of the second insulating layer 34 to contact or electrically connected to the exposed portion of the first redistribution layer (RDL) 33. In some embodiments, the second redistribution layer (RDL) 35 may include at least one integrated passive device (IPD) such as an inductor 351.

Figure 30:
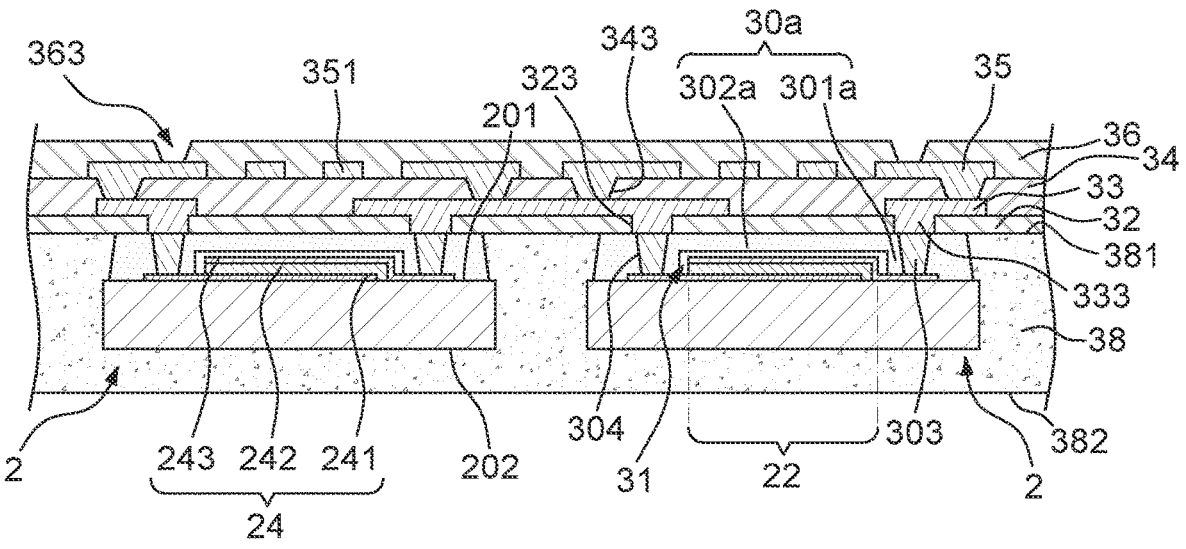
FIG. 30 illustrates one or more stages of an example of a method for manufacturing a package structure according to some embodiments of the present disclosure.

Referring to FIG. 30, the third insulating layer 36 is formed or disposed to cover at least portions of the second insulating layer 34 and the second redistribution layer (RDL) 35. The third insulating layer 36 defines at least one opening 363 extending through the third insulating layer 36 to expose a portion of the second redistribution layer (RDL) 35.

Figure 31:
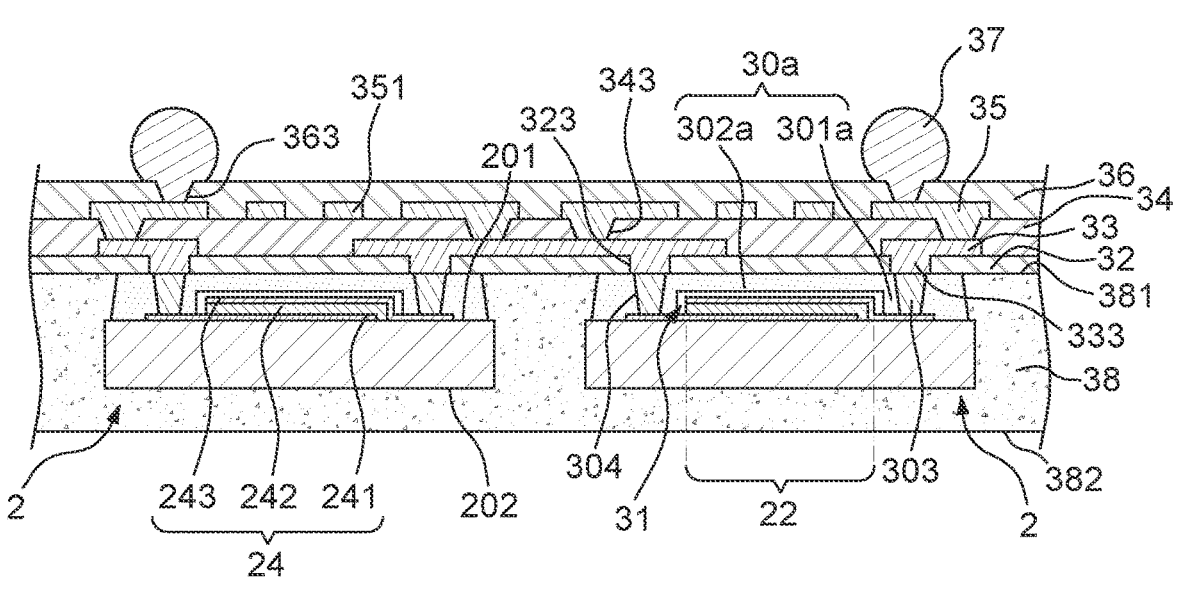
FIG. 31 illustrates one or more stages of an example of a method for manufacturing a package structure according to some embodiments of the present disclosure.

Referring to FIG. 31, the electrical connecting element 37 (e.g., solder bump) is attached to and electrically connected to the second redistribution layer (RDL) 35 through the opening 363 for external connection. Then, a singulation process is conducted to obtain the package structure 3a of FIG. 7.

FIG. 32 through FIG. 37 illustrate an example of a method for manufacturing a package structure according to some embodiments of the present disclosure. In some embodiments, the method is for manufacturing a package structure such as the package structure 3b shown in FIG. 8.

Figure 32:
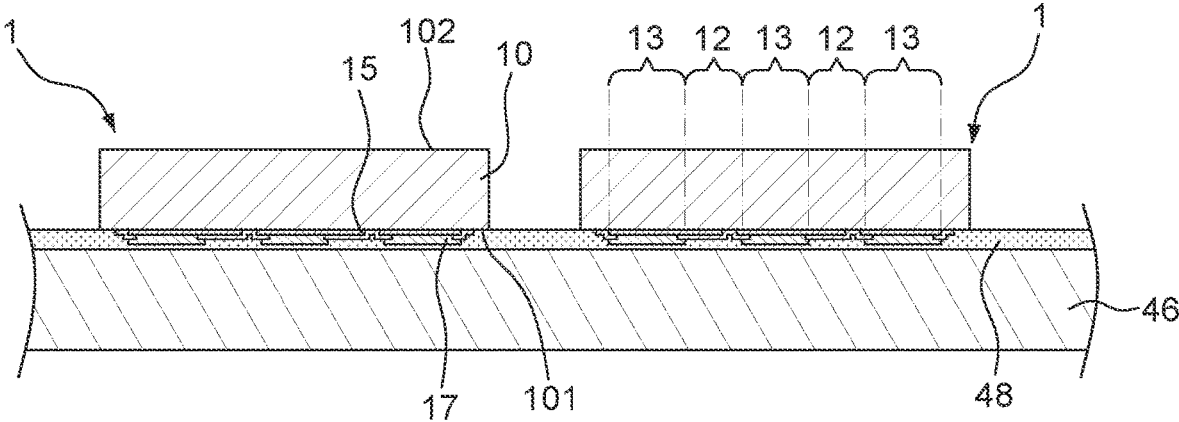
FIG. 32 illustrates a cross-sectional view of a package structure according to some embodiments of the present disclosure.

Referring to FIG. 32, a plurality of transducer devices 1 are disposed on or are adhered to a carrier 46 side by side through an adhesion layer 48. The first surface 101 of the die body 10 faces the carrier 46, and the first metal layer 15 and the second metal layer 17 are embedded in the adhesion layer 48.

Figure 33:
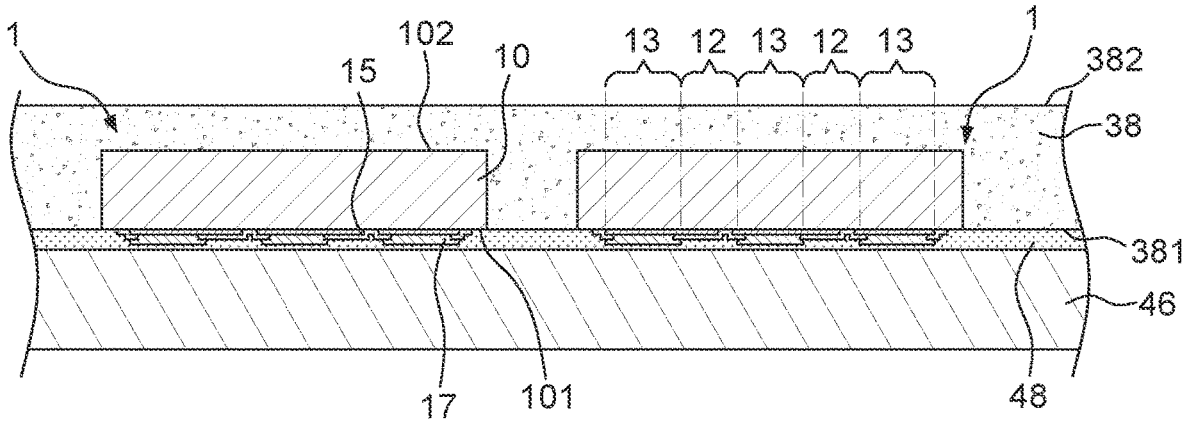
FIG. 33 illustrates a cross-sectional view of a package structure according to some embodiments of the present disclosure.

Referring to FIG. 33, the protection material 38 is formed or disposed on the adhesion layer 48 to cover the transducer devices 1. The protection material 38 has a first surface 381 contacting the adhesion layer 48 and a second surface 382 opposite to the first surface 381.

Figure 34:
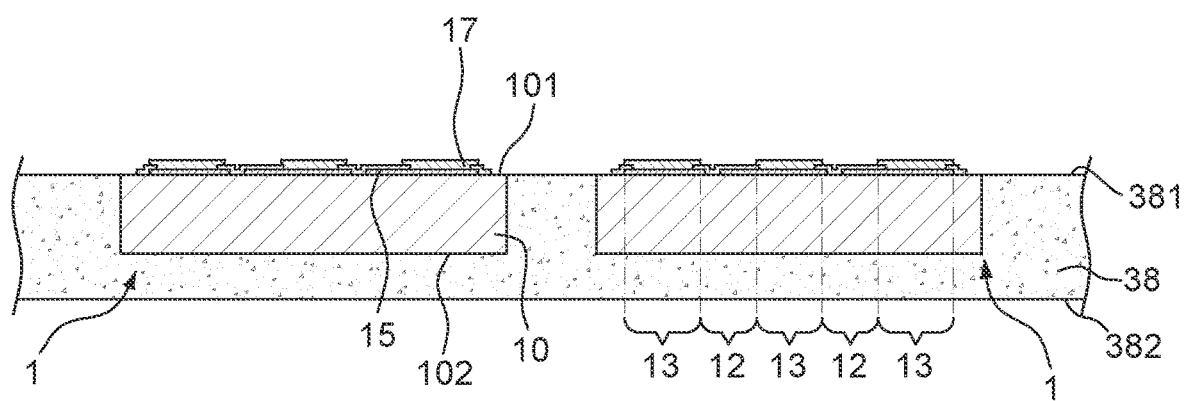
FIG. 34 illustrates a cross-sectional view of a package structure according to some embodiments of the present disclosure.

Referring to FIG. 34, the carrier 46 and the adhesion layer 48 are removed.

Figure 35:
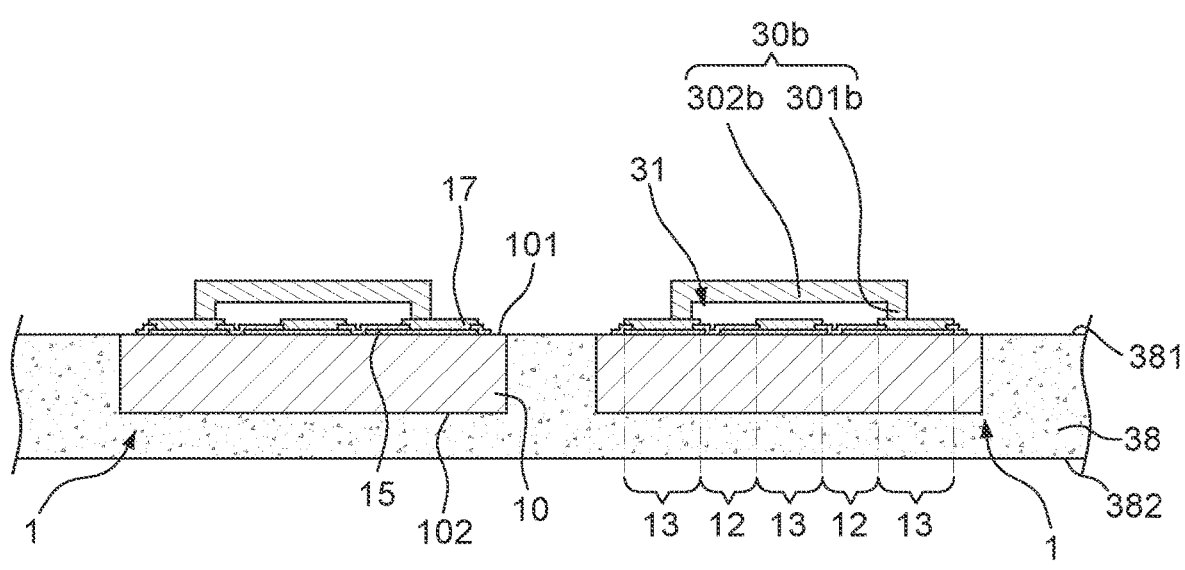
FIG. 35 illustrates one or more stages of an example of a method for manufacturing a package structure according to some embodiments of the present disclosure.

Referring to FIG. 35, the cap structure 30b is formed or disposed to cover the transducing region 12 of the transducer device 1 to form an enclosed space 31. The cap structure 30b may be a monolithic structure, and may include a side wall portion 301b and a roof portion 302b. Alternatively, the cap structure 30b may be the same as the cap structure 30 of FIG. 19.

Figure 36:
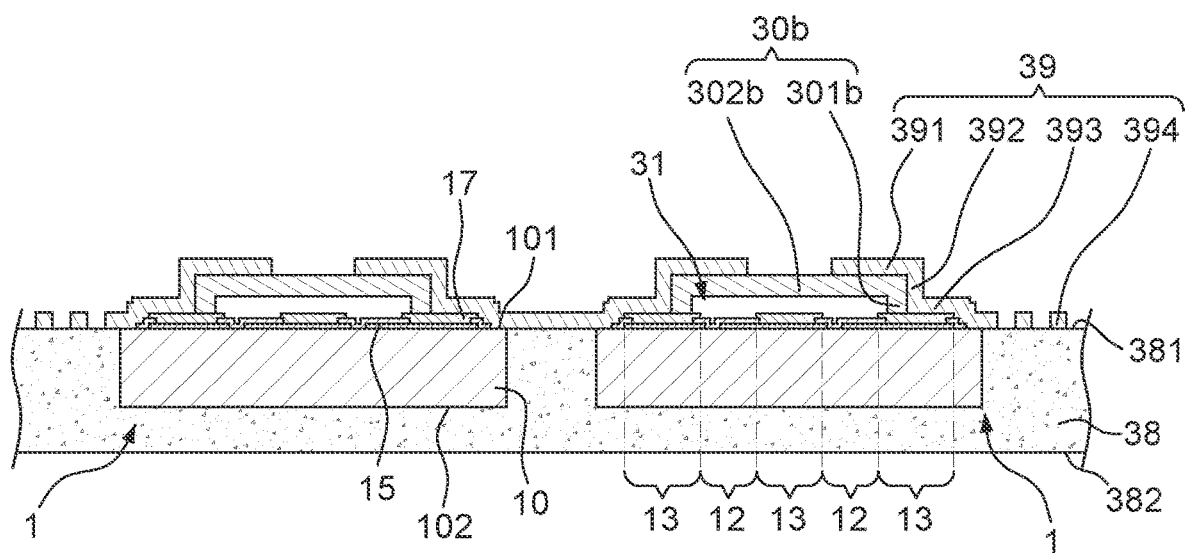
FIG. 36 illustrates one or more stages of an example of a method for manufacturing a package structure according to some embodiments of the present disclosure.

Referring to FIG. 36, the bottom redistribution layer (RDL) 39 is formed to electrically connect the transducer devices 1, and may include a first portion 391, a second portion 392, a third portion 393 and a fourth portion 394. The first portion 391 is disposed on and contacts the roof portion 302b. The second portion 392 is disposed on and contacts the side wall portion 301b. The third portion 393 is disposed on and contacts the conductive region 13 of the transducer device 1. The fourth portion 394 is disposed on and contacts the first surface 381 of the protection material 38. The fourth portion 394 may include the integrated passive device (IPD) such as an inductor.

Figure 37:
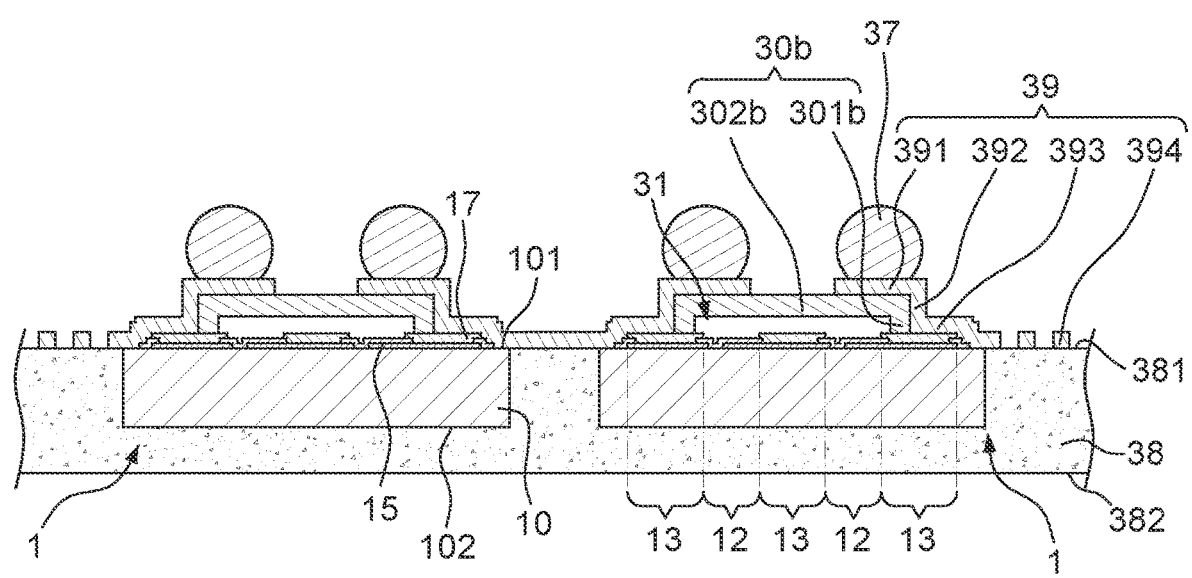
FIG. 37 illustrates one or more stages of an example of a method for manufacturing a package structure according to some embodiments of the present disclosure.

Referring to FIG. 37, the electrical connecting elements 37 are disposed on the first portion 391 for external connection. Then, a singulation process is conducted to obtain the package structure 3b of FIG. 8.

FIG. 38 through FIG. 42 illustrate an example of a method for manufacturing a package structure according to some embodiments of the present disclosure. In some embodiments, the method is for manufacturing a package structure such as the package structure 3c shown in FIG. 9.

Figure 38:
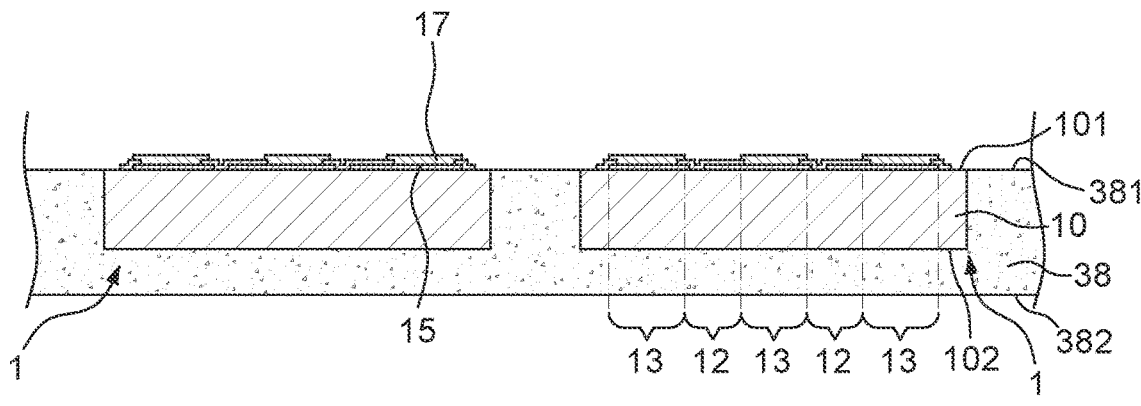
FIG. 38 illustrates one or more stages of an example of a method for manufacturing a package structure according to some embodiments of the present disclosure.

Referring to FIG. 38, a plurality of transducer devices 1 are disposed on or are adhered to a carrier 46 side by side through an adhesion layer 48 (FIG. 15). Then, the protection material 38 is formed or disposed on the adhesion layer 48 to cover the transducer devices 1 (FIG. 16). Then, the carrier 46 and the adhesion layer 48 are removed.

Figure 39:
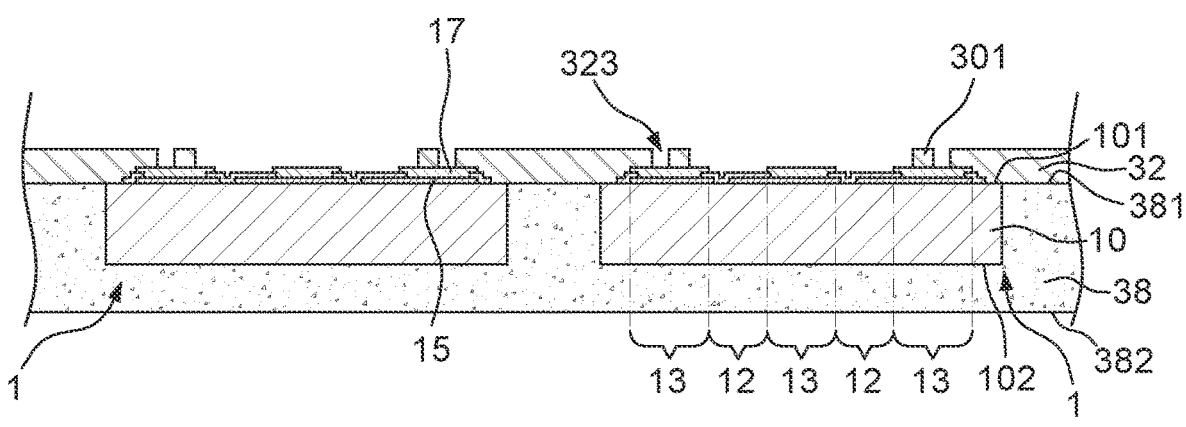
FIG. 39 illustrates one or more stages of an example of a method for manufacturing a package structure according to some embodiments of the present disclosure.

Referring to FIG. 39, the first insulating layer 32 is disposed or formed on the first surface 381 of the protection material 38 and the first surface 101 of the die body 10 of each of the transducer devices 1. The first insulating layer 32 defines at least one opening 323 extending through the first insulating layer 32 to expose the conductive region 13 of the transducer device 1. It is noted that the first insulating layer 32 may include a side wall portion 301 to expose the transducing region 12 of the transducer device 1. The side wall portion 301 surrounds the transducing region 12 to form a cavity.

Figure 40:
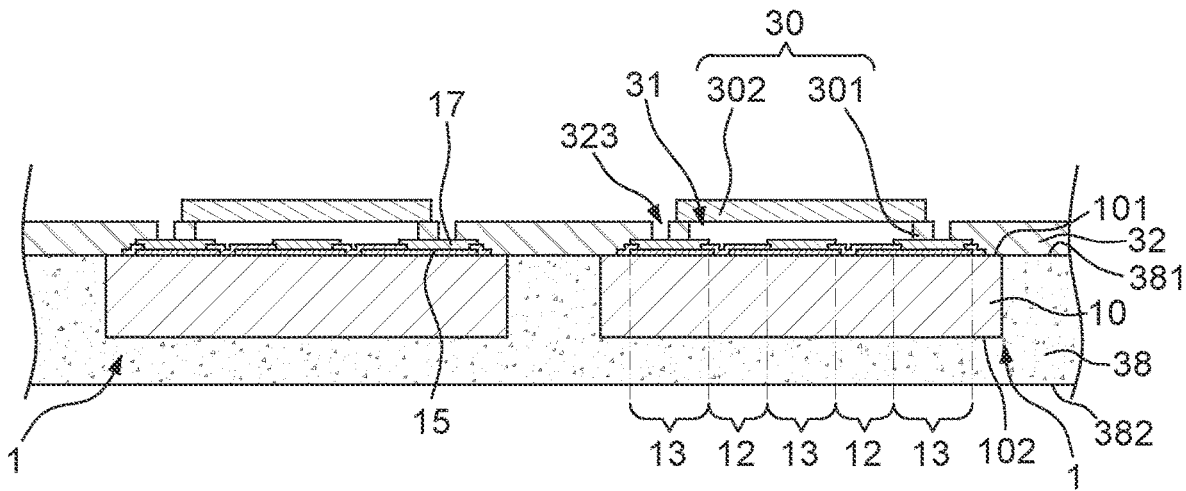
FIG. 40 illustrates one or more stages of an example of a method for manufacturing a package structure according to some embodiments of the present disclosure.

Referring to FIG. 40, a roof portion 302 is formed or disposed on the side wall portion 301 to cover the side wall portion 301 and the cavity completely to form the cap structure 30 so as to cover the transducing region 12 of the transducer device 1 to form an enclosed space 31.

Figure 41:
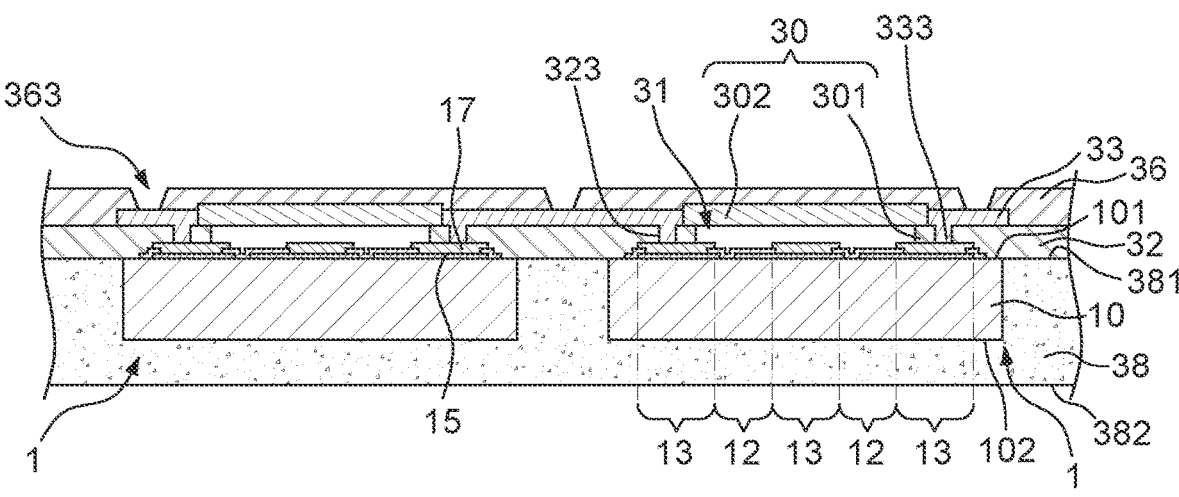
FIG. 41 illustrates one or more stages of an example of a method for manufacturing a package structure according to some embodiments of the present disclosure.

Referring to FIG. 41, the first redistribution layer (RDL) 33 is formed or disposed on the top surface of the first insulating layer 32 and in the opening 323 of the first insulating layer 32. Then, the third insulating layer 36 is formed or disposed to cover at least portions of the first insulating layer 32 and the first redistribution layer (RDL) 33. The third insulating layer 36 defines at least one opening 363 extending through the third insulating layer 36 to expose a portion of the first redistribution layer (RDL) 33.

Figure 42:
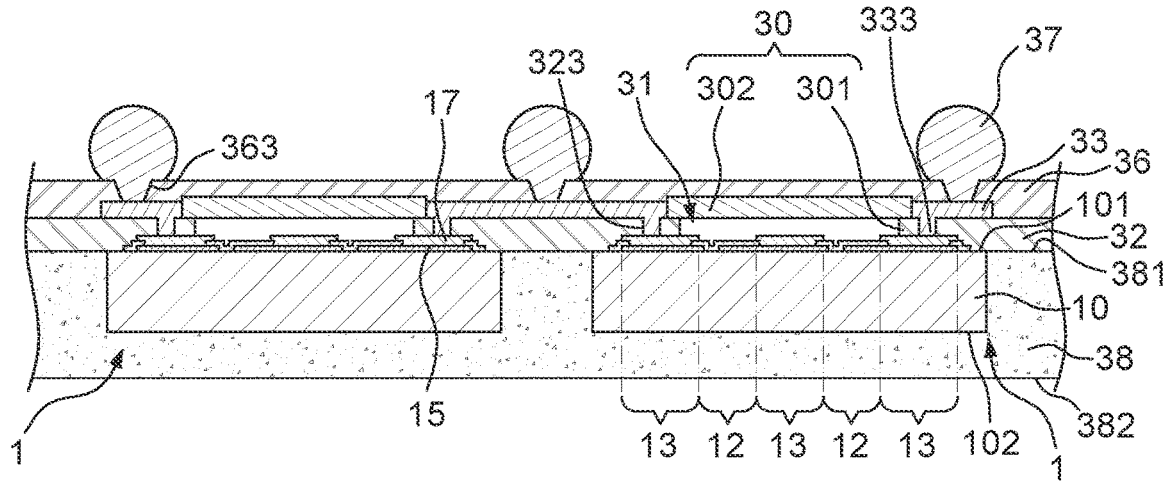
FIG. 42 illustrates one or more stages of an example of a method for manufacturing a package structure according to some embodiments of the present disclosure.

Referring to FIG. 42, the electrical connecting element 37 (e.g., solder bump) is attached to and electrically connected to the first redistribution layer (RDL) 35 through the opening 363 for external connection. Then, a singulation process is conducted to obtain the package structure 3c of FIG. 9.

FIG. 43 through FIG. 48 illustrate an example of a method for manufacturing a package structure according to some embodiments of the present disclosure. In some embodiments, the method is for manufacturing a package structure such as the package structure 3d shown in FIG. 10.

Figure 43:
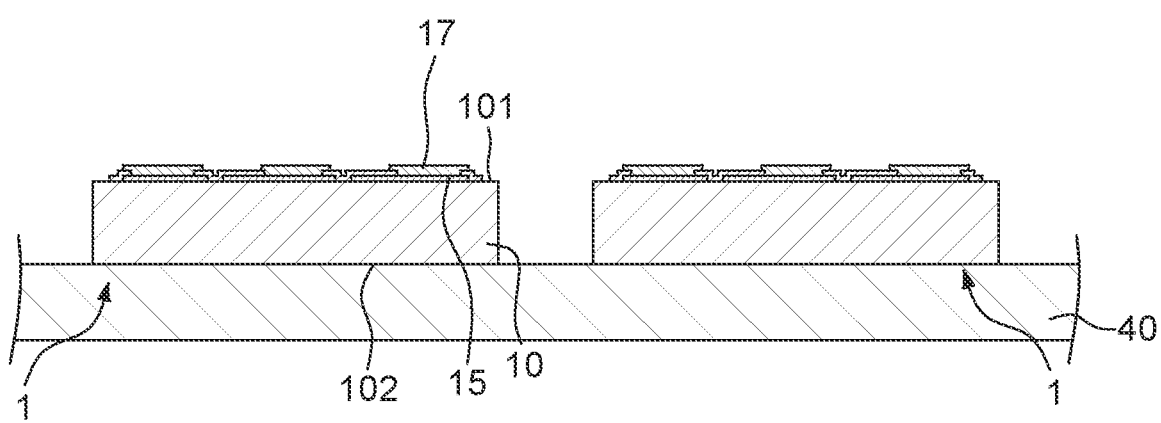
FIG. 43 illustrates one or more stages of an example of a method for manufacturing a package structure according to some embodiments of the present disclosure.

Referring to FIG. 43, a plurality of transducer devices 1 are disposed on or are adhered to a carrier 40 side by side. The second surface 102 of the die body 10 faces and is attached to the carrier 40.

Figure 44:
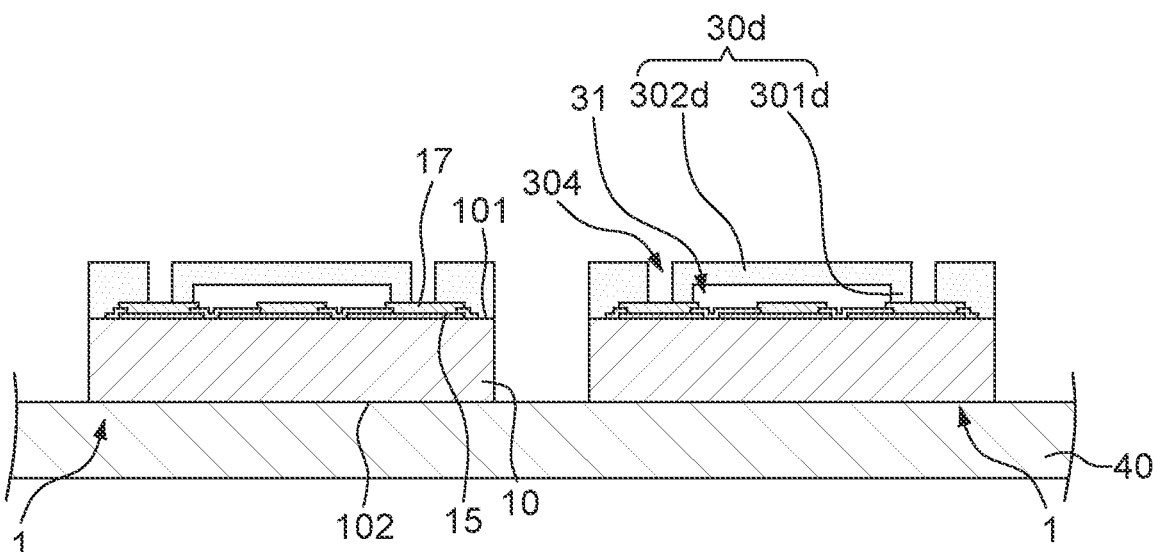
FIG. 44 illustrates one or more stages of an example of a method for manufacturing a package structure according to some embodiments of the present disclosure.

Referring to FIG. 44, the cap structure 30d is formed or disposed on the transducer device 1 to cover the transducing region 12 of the transducer device 1 and to form an enclosed space 31. The cap structure 30d may be a monolithic structure, and may include a side wall portion 301d and a roof portion 302d. Alternatively, the cap structure 30d may be the same as the cap structure 30 of FIG. 40. The side wall portion 301d defines a plurality of openings 304 to expose a portion of the conductive region 13 of the transducer device 1.

Figure 45:
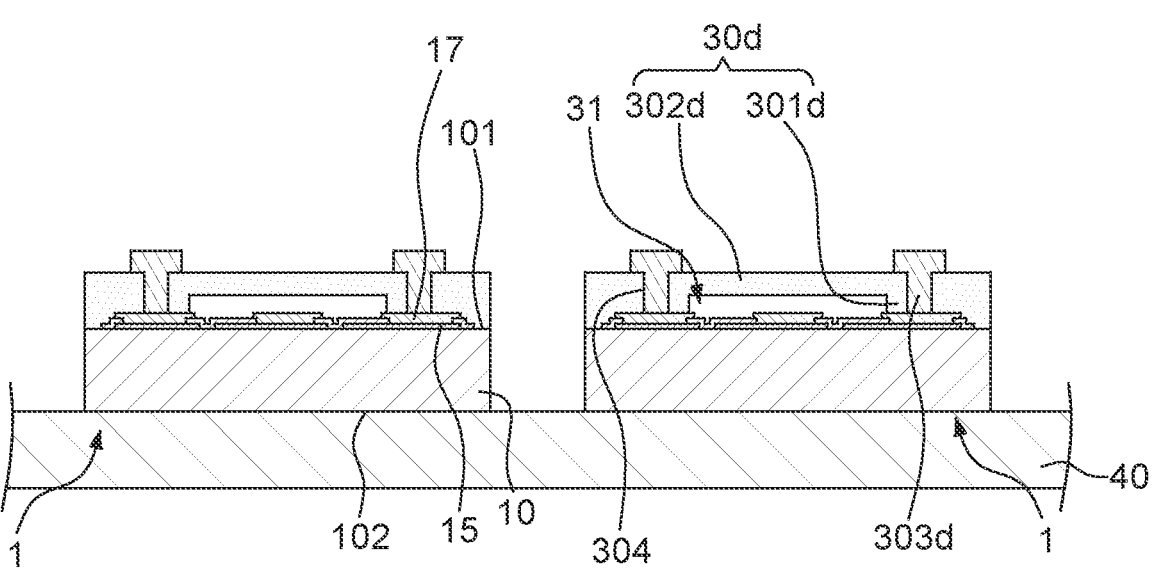
FIG. 45 illustrates one or more stages of an example of a method for manufacturing a package structure according to some embodiments of the present disclosure.

Referring to FIG. 45, a plurality of periphery conductive vias 303d are disposed in the openings 304 to contact and electrically connect the exposed portion of the conductive region 13 of the transducer device 1. The top ends of the periphery conductive vias 303d protrude from the roof portion 302d.

Figure 46:
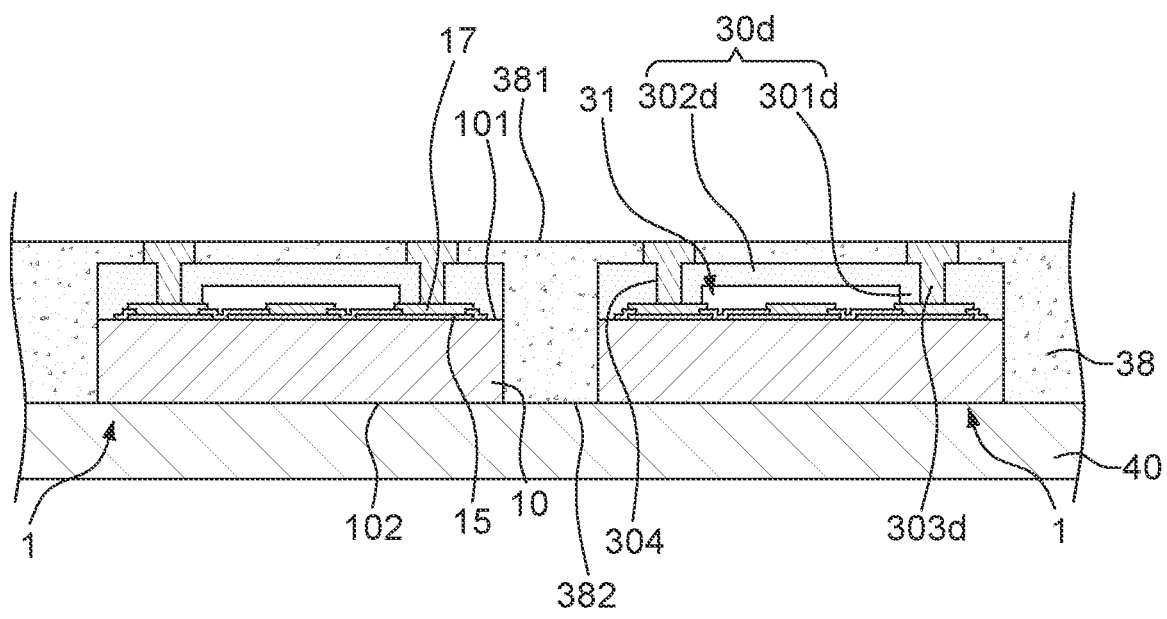
FIG. 46 illustrates one or more stages of an example of a method for manufacturing a package structure according to some embodiments of the present disclosure.

Referring to FIG. 46, the protection material 38 is formed or disposed on the carrier 40 to cover the transducer devices 1. The protection material 38 has a second surface 382 contacting the carrier 40 and a first surface 381 opposite to the second surface 382. The second surface 382 of the protection material 38 is attached to a surface of the carrier 40. The protection material 38 covers the sidewall of the die body 10 of each of the transducer devices 1 and the cap structure 30d. The first surface 381 of the protection material 38 may be substantially coplanar with the top surface of the periphery conductive vias 303d.

Figure 47:
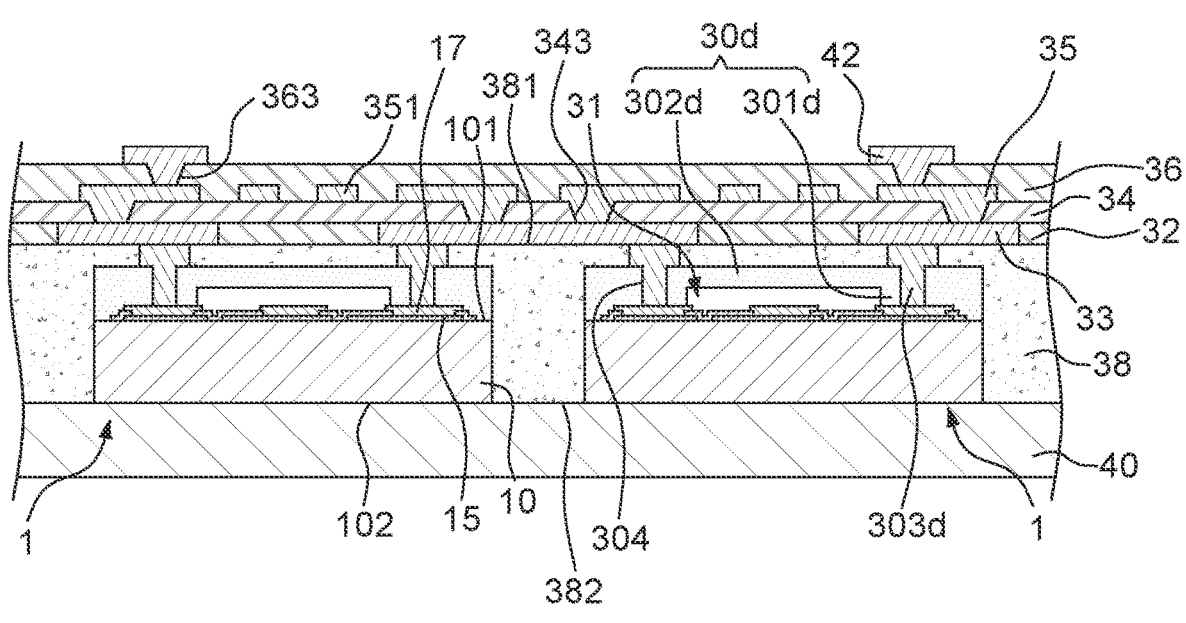
FIG. 47 illustrates one or more stages of an example of a method for manufacturing a package structure according to some embodiments of the present disclosure.

Referring to FIG. 47, the first insulating layer 32, the first redistribution layer (RDL) 33, the second insulating layer 34, the second redistribution layer (RDL) 35, the third insulating layer 36 and the third redistribution layer (RDL) 42 are formed on the first surface 381 of the protection material 38. The thickness of the first insulating layer 32 is substantially equal to the thickness of the first redistribution layer (RDL) 33. The third redistribution layer (RDL) 42 may be a patterned circuit structure, and is disposed on the top surface of the third insulating layer 36 and in the opening 363 of the third insulating layer 36 to contact or electrically connected to portions of the second redistribution layer (RDL) 35.

Figure 48:
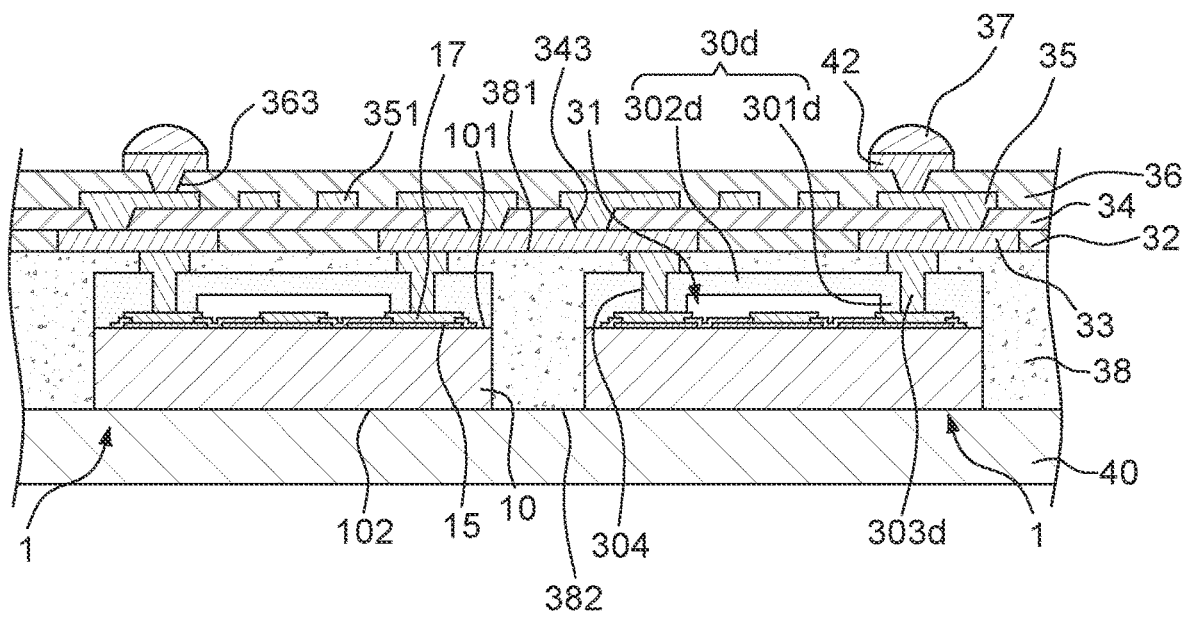
FIG. 48 illustrates one or more stages of an example of a method for manufacturing a package structure according to some embodiments of the present disclosure.

Referring to FIG. 48, the electrical connecting elements 37 are formed or disposed on the third redistribution layer (RDL) 42 for external connection. Then, a singulation process is conducted to obtain the package structure 3d of FIG. 10.

FIG. 49 through FIG. 54 illustrate an example of a method for manufacturing a package structure according to some embodiments of the present disclosure. In some embodiments, the method is for manufacturing a package structure such as the package structure 3e shown in FIG. 11.

Figure 49:
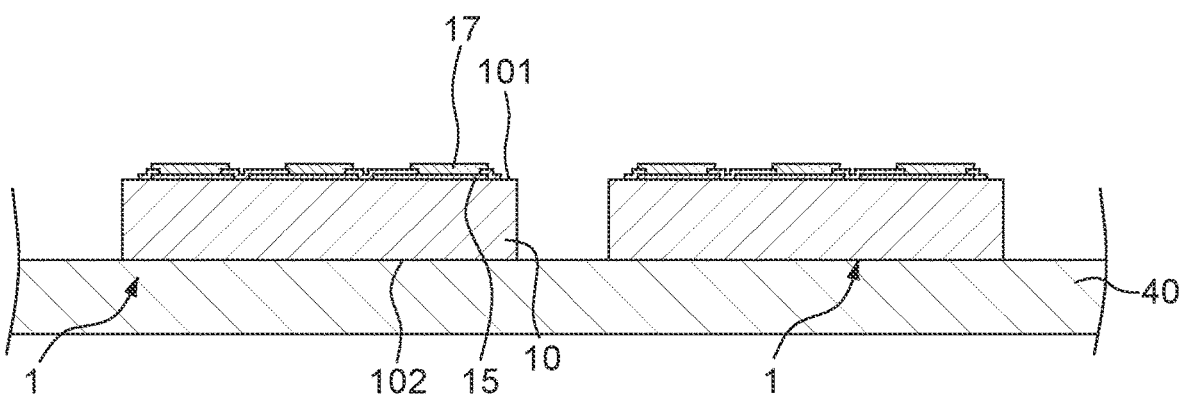
FIG. 49 illustrates one or more stages of an example of a method for manufacturing a package structure according to some embodiments of the present disclosure.

Referring to FIG. 49, a plurality of transducer devices 1 are disposed on or are adhered to a carrier 40 side by side. The second surface 102 of the die body 10 faces and is attached to the carrier 40.

Figure 50:
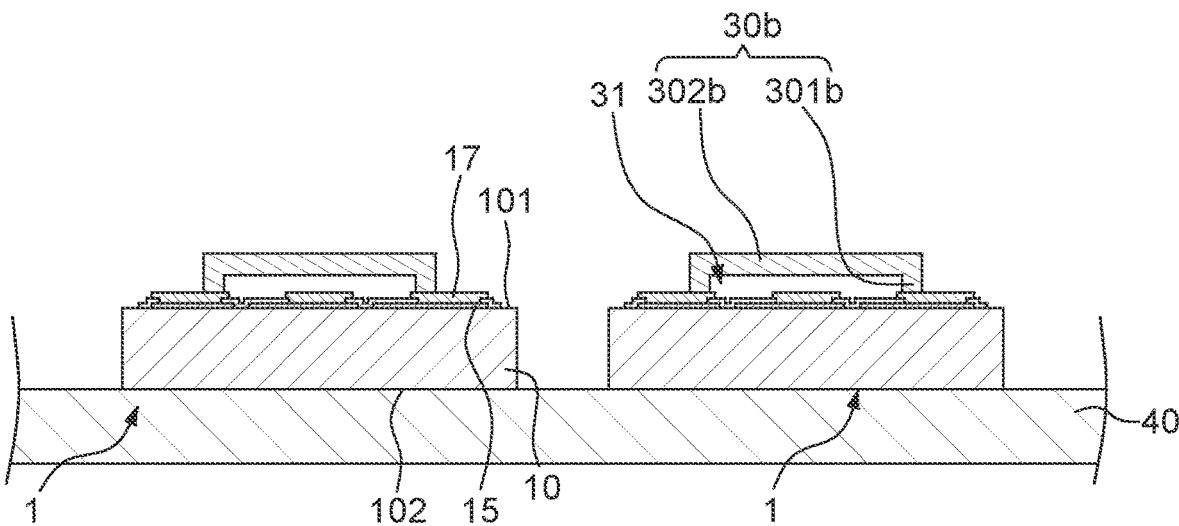
FIG. 50 illustrates one or more stages of an example of a method for manufacturing a package structure according to some embodiments of the present disclosure.

Referring to FIG. 50, the cap structure 30b is formed or disposed on the transducer device 1 to cover the transducing region 12 of the transducer device 1 and to form an enclosed space 31. The cap structure 30b may be a monolithic structure, and may include a side wall portion 301b and a roof portion 302b. Alternatively, the cap structure 30b may be the same as the cap structure 30 of FIG. 40.

Figure 51:
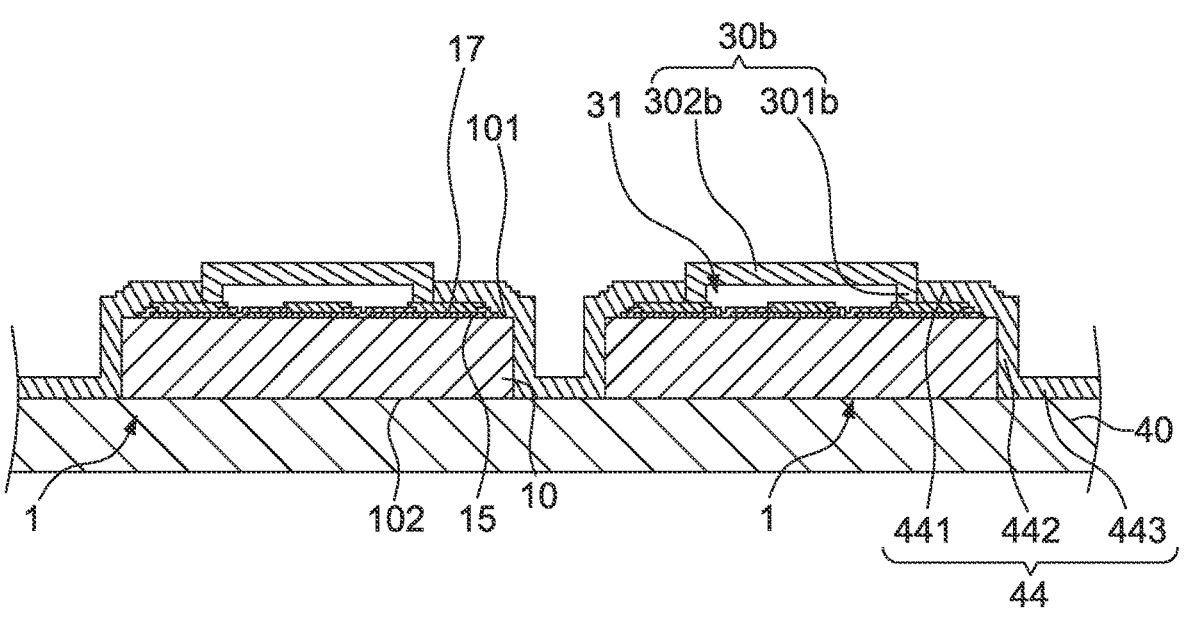
FIG. 51 illustrates one or more stages of an example of a method for manufacturing a package structure according to some embodiments of the present disclosure.

Referring to FIG. 51, a bottom redistribution layer (RDL) 44 is formed to electrically connect the transducer devices 1. The bottom redistribution layer (RDL) 44 includes a first portion 441, a second portion 442 a third portion 443. The first portion 441 is disposed on and contacts the conductive region 13 of the transducer device 1. The second portion 442 is disposed on and contacts the side surface of the die body 10 of the transducer device 1. The third portion 443 is disposed on and contacts the surface of the carrier 40.

Figure 52:
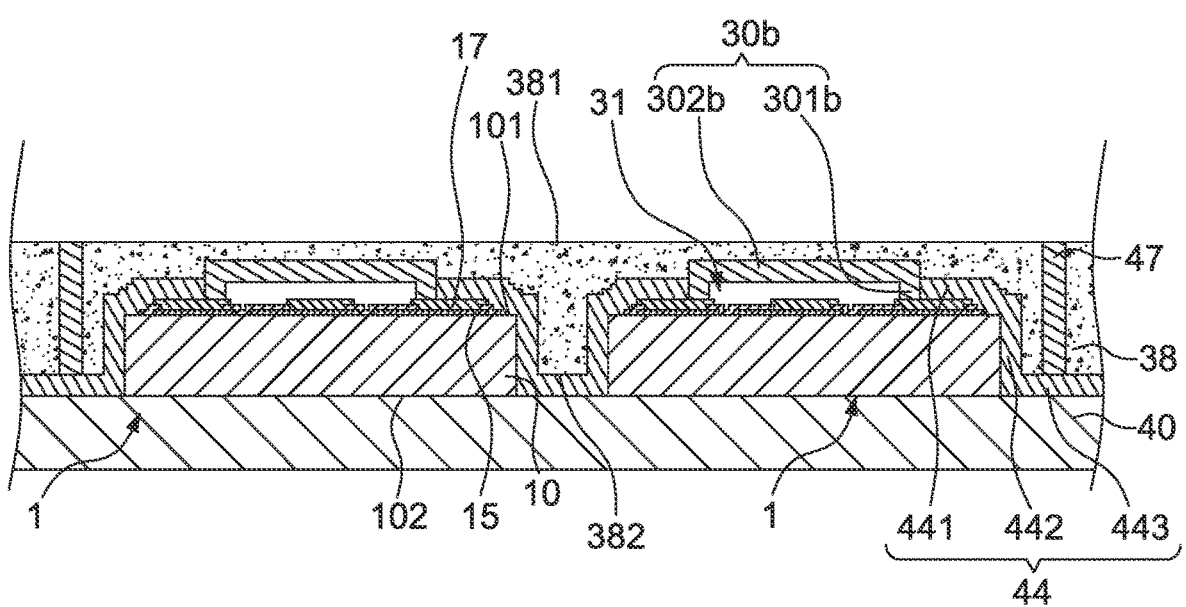
FIG. 52 illustrates one or more stages of an example of a method for manufacturing a package structure according to some embodiments of the present disclosure.

Referring to FIG. 52, the protection material 38 is formed or disposed on the carrier 40 to cover the transducer devices 1, the cap structures 30b and the bottom redistribution layer (RDL) 44. The protection material 38 has a second surface 382 contacting the carrier 40 and a first surface 381 opposite to the second surface 382. The protection material 38 covers the sidewall of the die body 10 of each of the transducer devices 1 and the cap structure 30b. Then, a plurality of outer conductive vias 46 are formed to extend through the protection material 38, and electrically connect and contact the third portion 443 of the bottom redistribution layer (RDL) 44.

Figure 53:
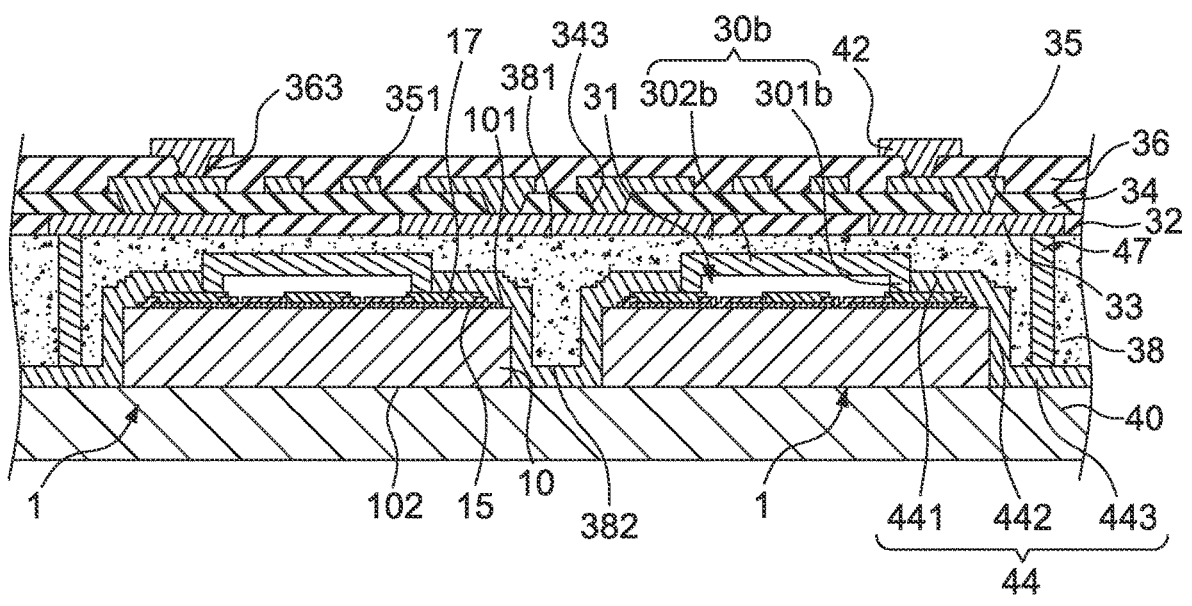
FIG. 53 illustrates one or more stages of an example of a method for manufacturing a package structure according to some embodiments of the present disclosure.

Referring to FIG. 53, the first insulating layer 32, the first redistribution layer (RDL) 33, the second insulating layer 34, the second redistribution layer (RDL) 35, the third insulating layer 36 and the third redistribution layer (RDL) 42 are formed on the first surface 381 of the protection material 38. The first redistribution layer (RDL) 33 contacts the outer conductive vias 46.

Figure 54:
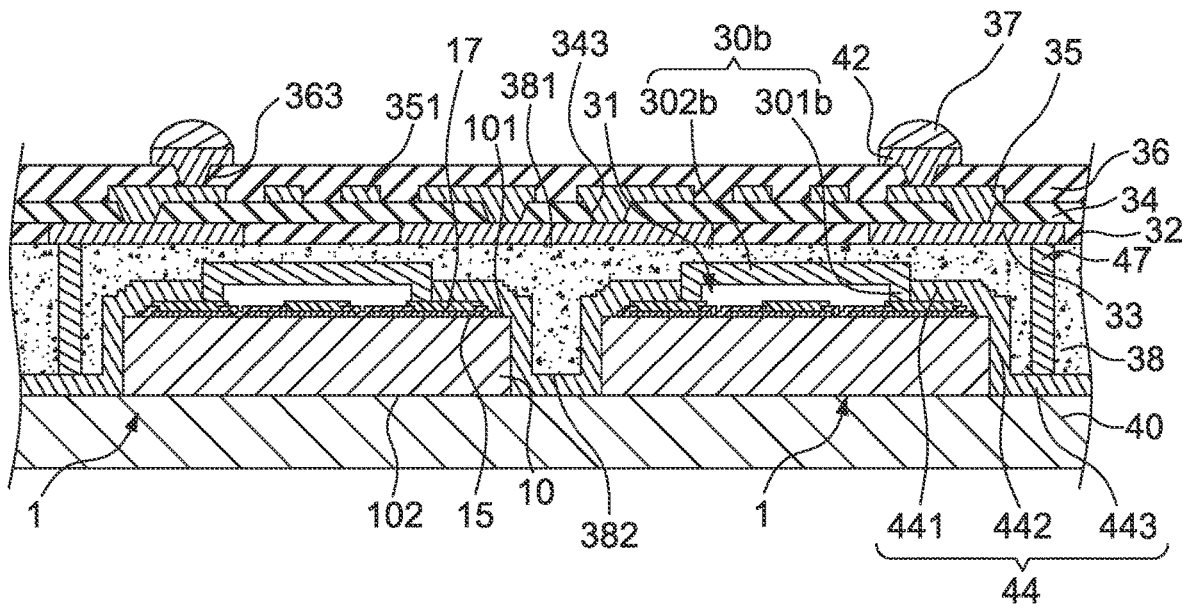
FIG. 54 illustrates one or more stages of an example of a method for manufacturing a package structure according to some embodiments of the present disclosure.

Referring to FIG. 54, the electrical connecting elements 37 are formed or disposed on the third redistribution layer (RDL) 42 for external connection. Then, a singulation process is conducted to obtain the package structure 3e of FIG. 11.

FIG. 55 through FIG. 61 illustrate an example of a method for manufacturing a package structure according to some embodiments of the present disclosure. In some embodiments, the method is for manufacturing a package structure such as the package structure 3f shown in FIG. 12.

Figure 55:
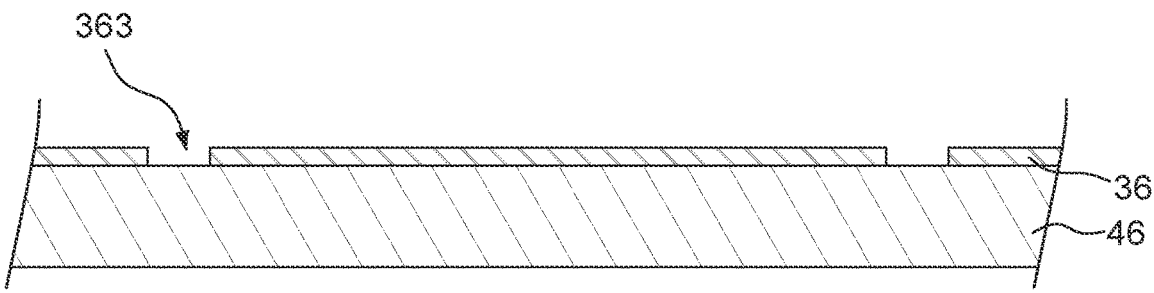
FIG. 55 illustrates one or more stages of an example of a method for manufacturing a package structure according to some embodiments of the present disclosure.

Referring to FIG. 55, the third insulating layer 36 is formed on the carrier 46. The third insulating layer 36 defines at least one opening 363 extending through the third insulating layer 36.

Figure 56:
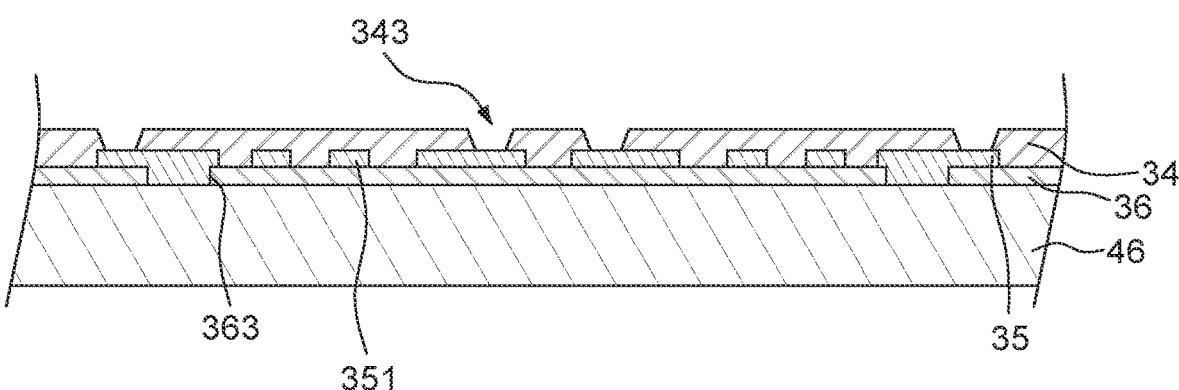
FIG. 56 illustrates one or more stages of an example of a method for manufacturing a package structure according to some embodiments of the present disclosure.

Referring to FIG. 56, the second redistribution layer (RDL) 35 is formed or disposed on the third insulating layer 36 and in the opening 363. Then, the second insulating layer 34 is formed or disposed to cover the third insulating layer 36 and the second redistribution layer (RDL) 35. The second insulating layer 34 defines at least one opening 343 to expose a portion of the second redistribution layer (RDL) 35.

Figure 57:
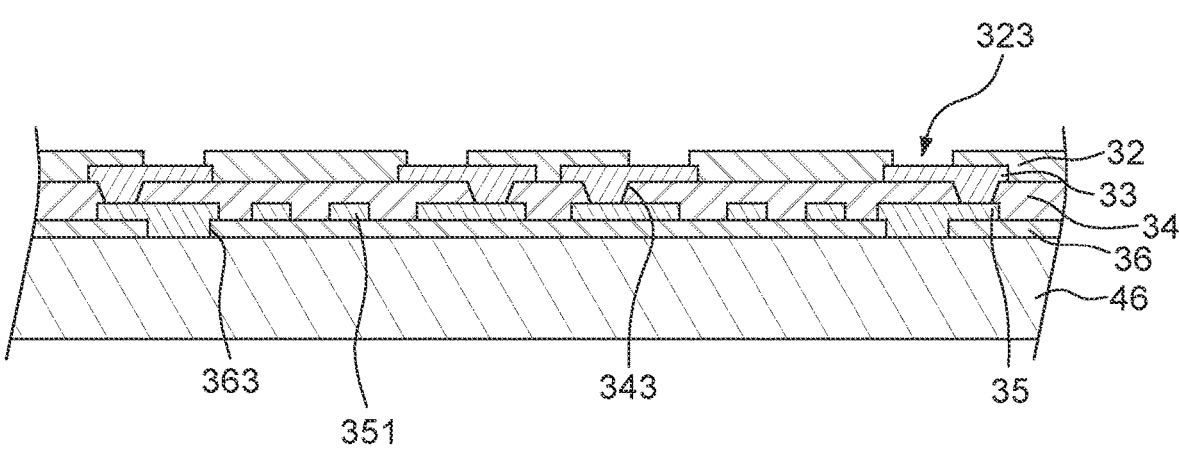
FIG. 57 illustrates one or more stages of an example of a method for manufacturing a package structure according to some embodiments of the present disclosure.

Referring to FIG. 57, the first redistribution layer (RDL) 33 is formed or disposed on the second insulating layer 34 and in the opening 343. Then, the first insulating layer 32 is formed or disposed to cover the second insulating layer 34 and the first redistribution layer (RDL) 33. The first insulating layer 32 defines at least one opening 323 to expose a portion of the first redistribution layer (RDL) 33.

Figure 58:
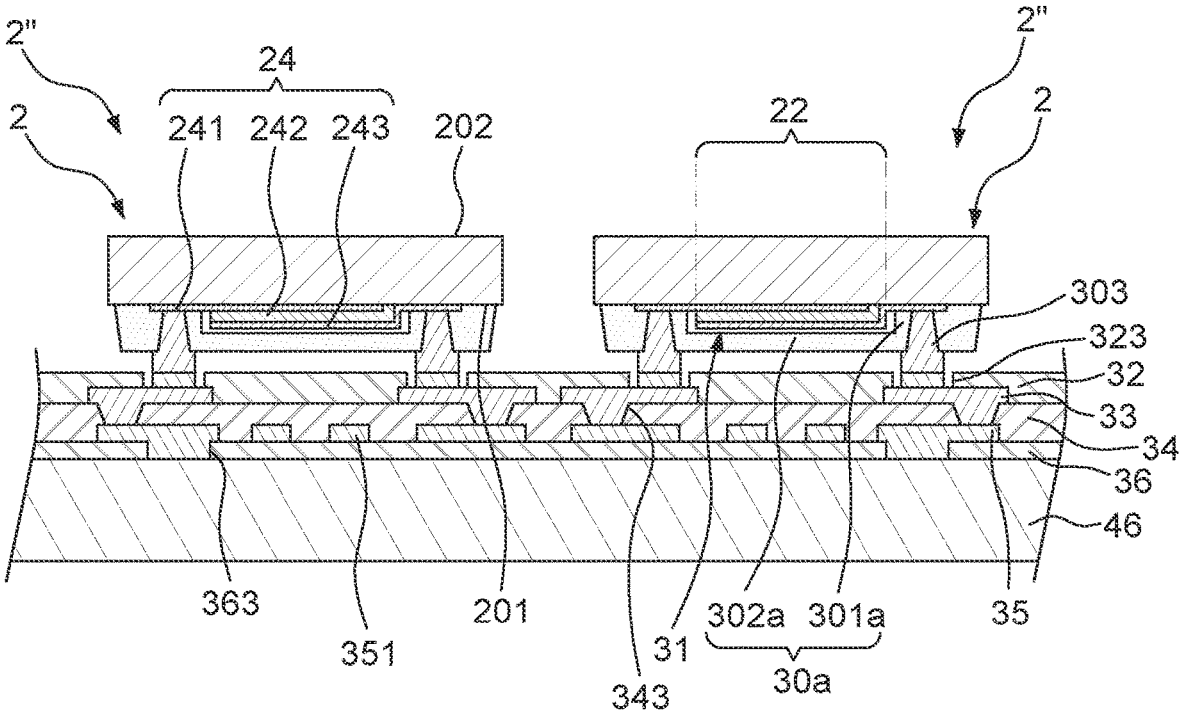
FIG. 58 illustrates one or more stages of an example of a method for manufacturing a package structure according to some embodiments of the present disclosure.

Referring to FIG. 58, a plurality of units 2″ are provided. The unit 2″ is similar to the unit 2′ of FIG. 22 except that the periphery conductive vias 303 protrude from the roof portion 302a. Then, the periphery conductive vias 303 of the units 2″ are attached to the exposed portions of the first redistribution layer (RDL) 33 exposed from the opening 323 so that the transducer devices 2 are electrically connected to the first redistribution layer (RDL) 33.

Figure 59:
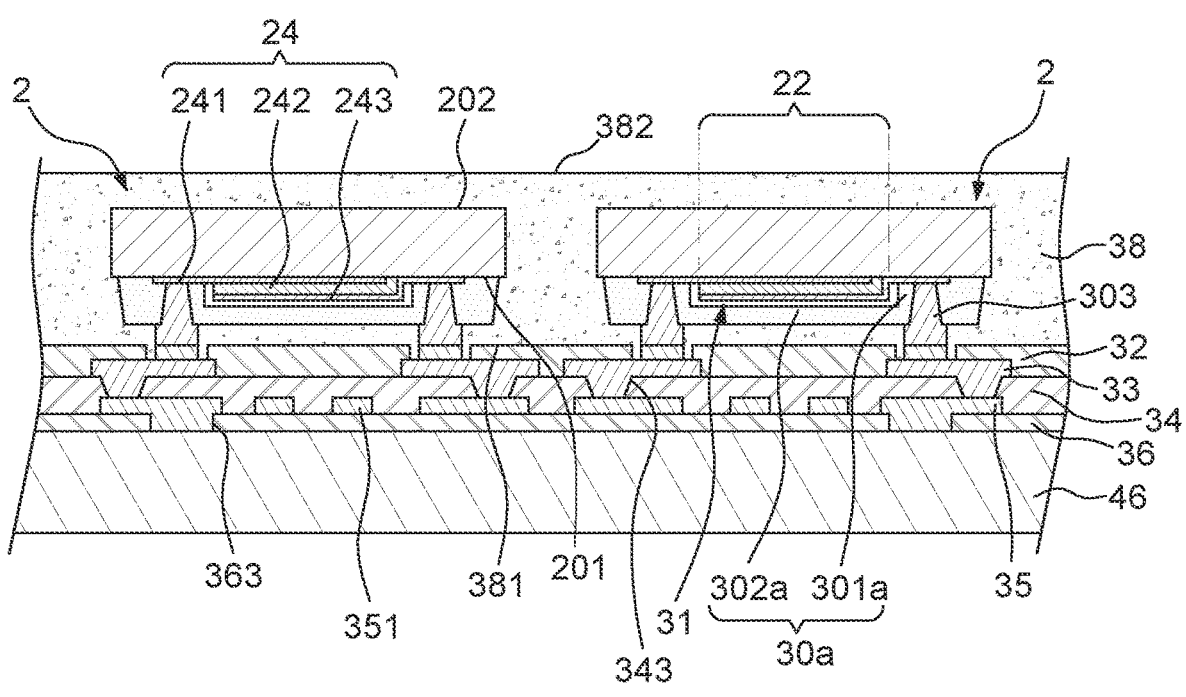
FIG. 59 illustrates one or more stages of an example of a method for manufacturing a package structure according to some embodiments of the present disclosure.

Referring to FIG. 59, the protection material 38 is formed or disposed on the first insulating layer 32 to cover the units 2″ (e.g., the transducer devices 2 and the cap structures 30a). The protection material 38 has a first surface 381 contacting the first insulating layer 32 and a second surface 382 opposite to the first surface 381.

Figure 60:
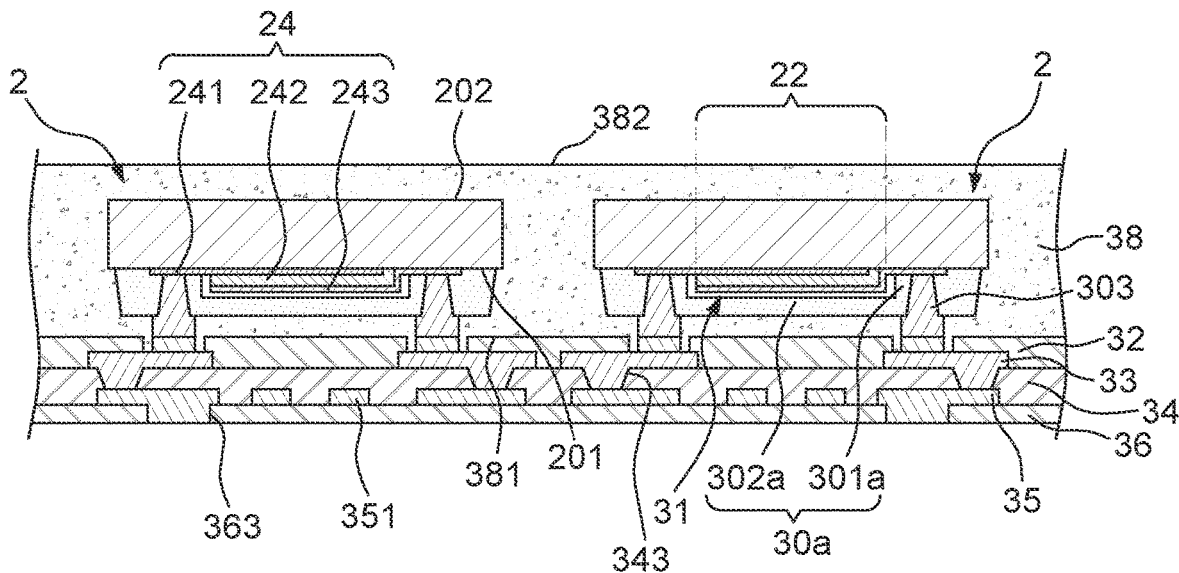
FIG. 60 illustrates one or more stages of an example of a method for manufacturing a package structure according to some embodiments of the present disclosure.

Referring to FIG. 60, the carrier 46 is removed to expose portions of the second redistribution layer (RDL) 35.

Figure 61:
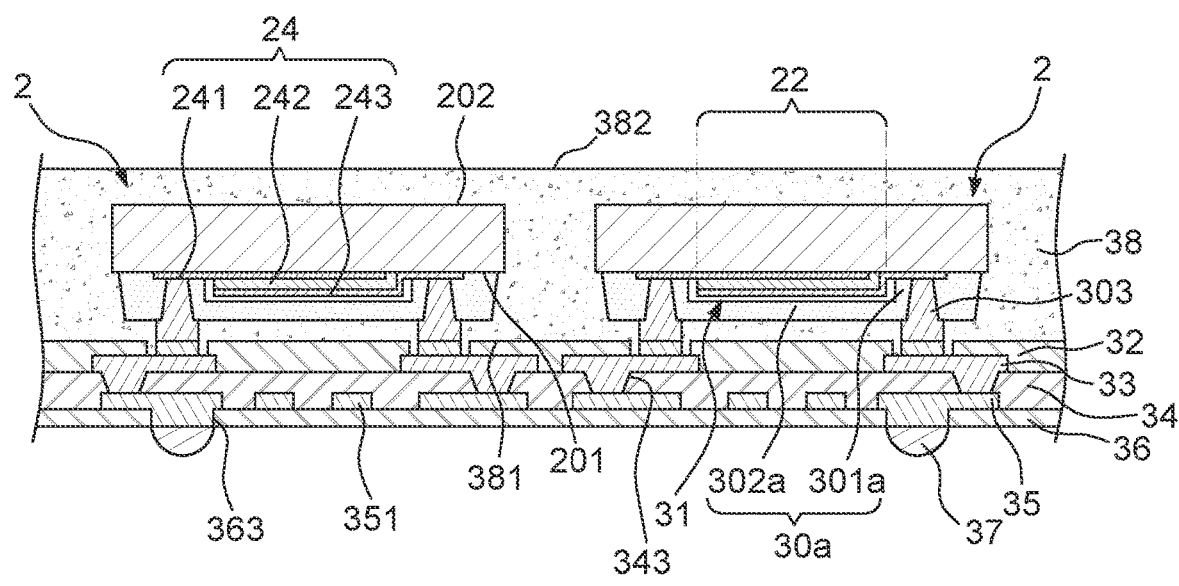
FIG. 61 illustrates one or more stages of an example of a method for manufacturing a package structure according to some embodiments of the present disclosure.

Referring to FIG. 61, the electrical connecting elements 37 are formed or disposed on the exposed portions of the second redistribution layer (RDL) 35 for external connection. Then, a singulation process is conducted to obtain the package structure 3f of FIG. 12.

FIG. 62 through FIG. 69 illustrate an example of a method for manufacturing a package structure according to some embodiments of the present disclosure. In some embodiments, the method is for manufacturing a package structure such as the package structure 3g shown in FIG. 13.

Figure 62:
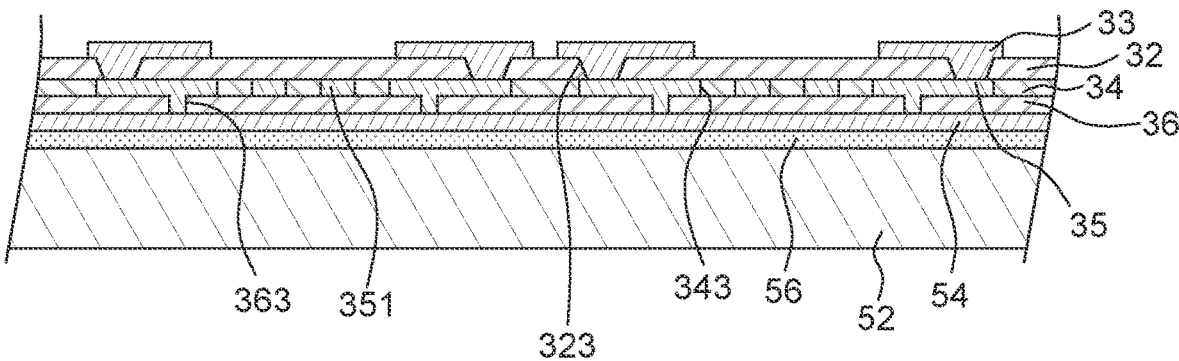
FIG. 62 illustrates one or more stages of an example of a method for manufacturing a package structure according to some embodiments of the present disclosure.

Referring to FIG. 62, a first carrier 52 with a first release layer 56 is provided. Then, a bottom metal layer 54 is formed or disposed on the first release layer 56. Then, the third insulating layer 36 is formed on the bottom metal layer 54. The third insulating layer 36 defines at least one opening 363 extending through the third insulating layer 36. Then, the second insulating layer 34 is formed or disposed on the third insulating layer 36. The second insulating layer 34 defines at least one opening 343 to expose the opening 363 of the third insulating layer 36. Then, the second redistribution layer (RDL) 35 is formed or disposed on the third insulating layer 36 and in the opening 363, and in the opening 343 of the second insulating layer 34. Then, the first insulating layer 32 is formed or disposed to cover the second insulating layer 34 and the second redistribution layer (RDL) 35. The first insulating layer 32 defines at least one opening 323 to expose a portion of the second redistribution layer (RDL) 35. Then, the first redistribution layer (RDL) 33 is formed or disposed on the second insulating layer 34 and in the opening 323 of the first insulating layer 32.

Figure 63:
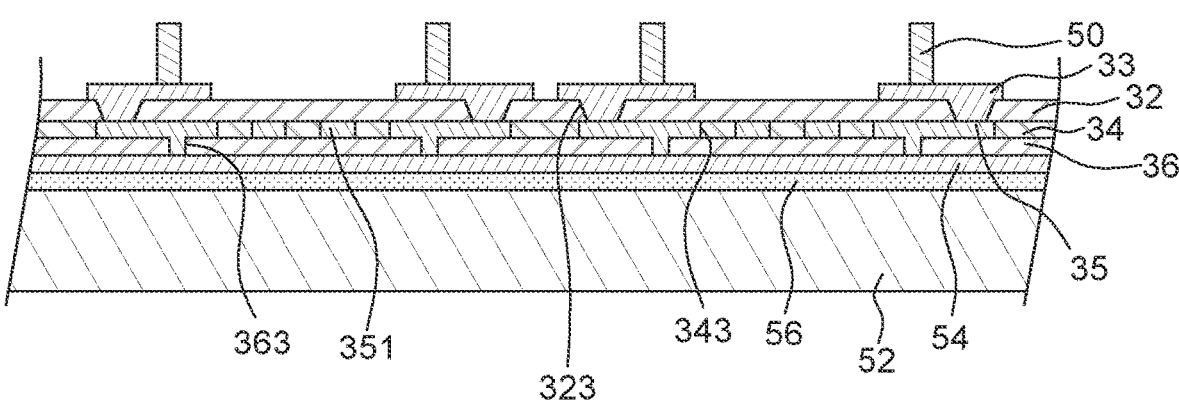
FIG. 63 illustrates one or more stages of an example of a method for manufacturing a package structure according to some embodiments of the present disclosure.

Referring to FIG. 63, a plurality of conductive pillars 50 are form or disposed on the first redistribution layer (RDL) 33.

Figure 64:
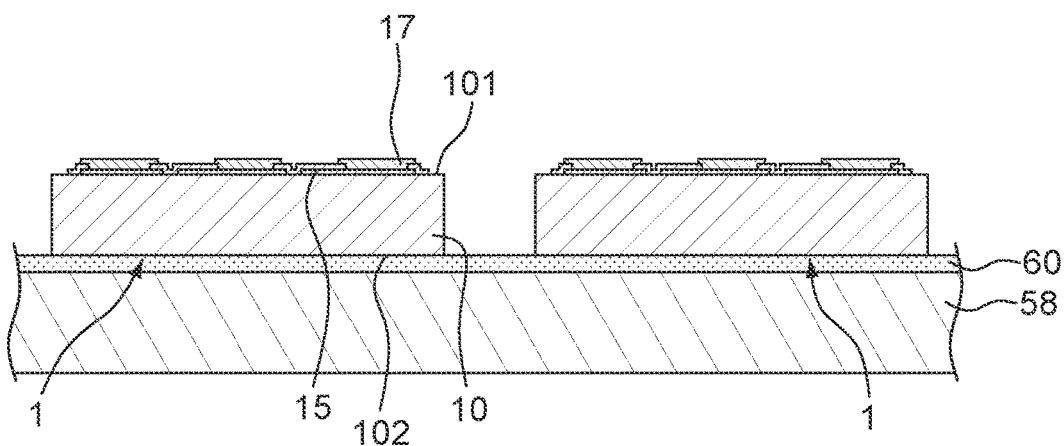
FIG. 64 illustrates one or more stages of an example of a method for manufacturing a package structure according to some embodiments of the present disclosure.

Referring to FIG. 64, a second carrier 58 with a second release layer 60 is provided. Then, a plurality of transducer devices 1 are disposed on or are adhered to the second release layer 60 of the second carrier 58 side by side. The second surface 102 of the die body 10 faces and is attached to the second release layer 60 of the second carrier 58.

Figure 65:
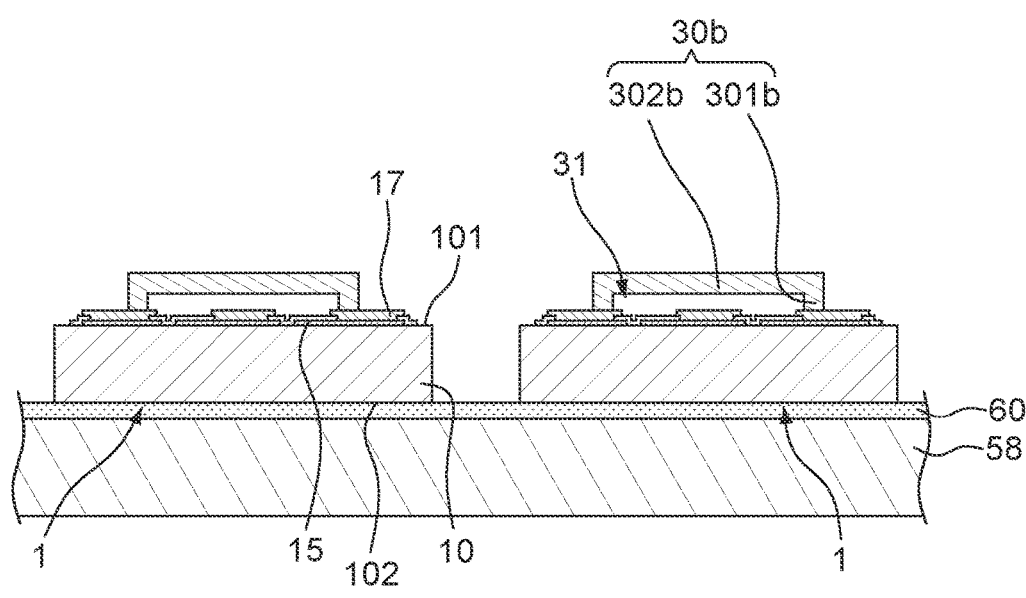
FIG. 65 illustrates one or more stages of an example of a method for manufacturing a package structure according to some embodiments of the present disclosure.

Referring to FIG. 65, the cap structure 30b is formed or disposed to cover the transducing region 12 of the transducer device 1 to form an enclosed space 31. The cap structure 30b may be a monolithic structure, and may include a side wall portion 301b and a roof portion 302b. Alternatively, the cap structure 30b may be the same as the cap structure 30 of FIG. 40.

Figure 66:
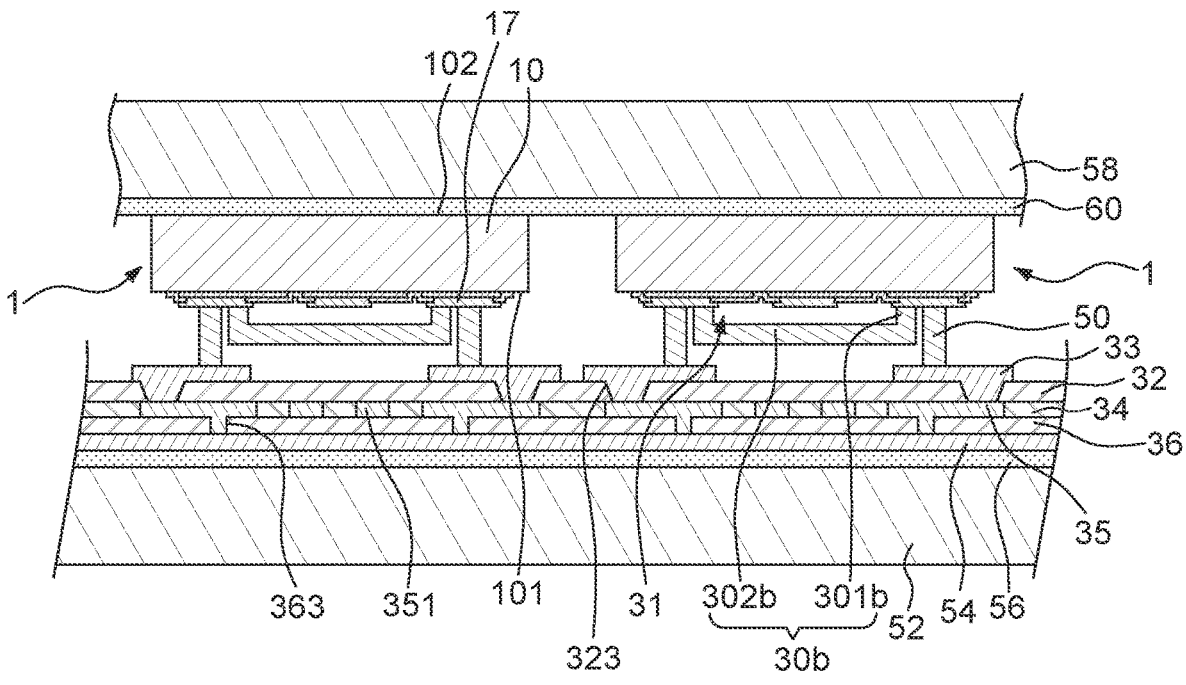
FIG. 66 illustrates one or more stages of an example of a method for manufacturing a package structure according to some embodiments of the present disclosure.

Referring to FIG. 66, the structure of FIG. 65 is attached to the structure of FIG. 63 so that the conductive pillars 50 are disposed outside the cap structure 30b and surround the cap structure 30b. Thus, the first redistribution layer (RDL) 33 is electrically connected to the conductive regions 13 of the transducer devices 1 through the conductive pillars 50.

Figure 67:
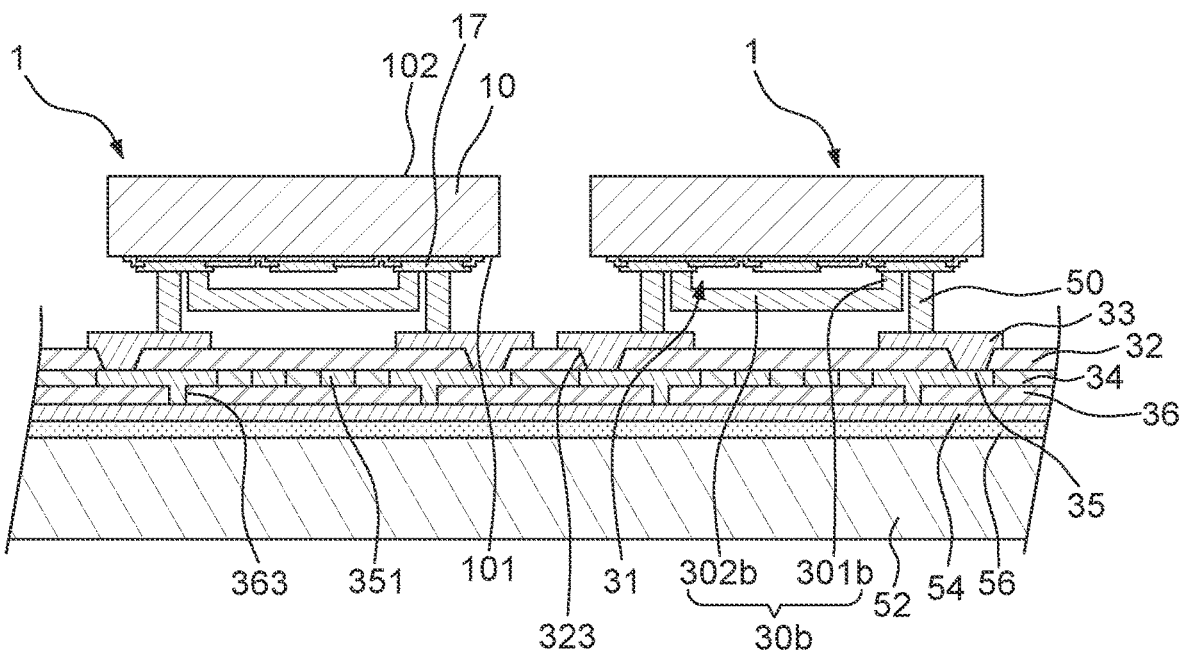
FIG. 67 illustrates one or more stages of an example of a method for manufacturing a package structure according to some embodiments of the present disclosure.

Referring to FIG. 67, the second carrier 58 and the second release layer 60 are removed.

Figure 68:
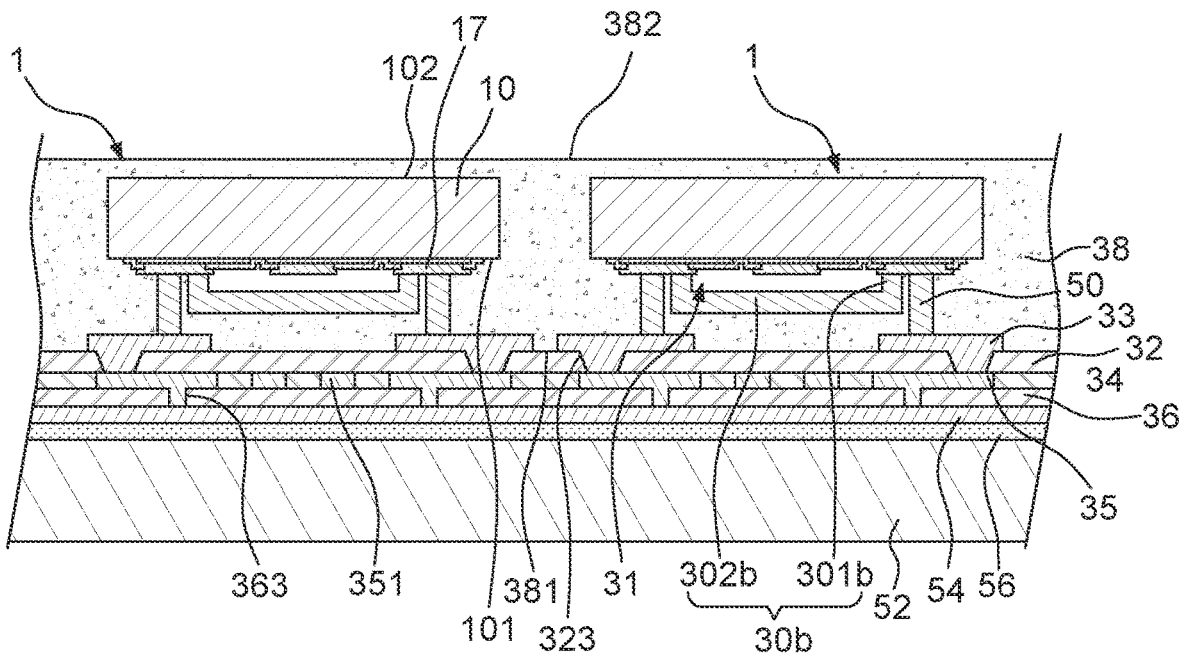
FIG. 68 illustrates one or more stages of an example of a method for manufacturing a package structure according to some embodiments of the present disclosure.

Referring to FIG. 68, the protection material 38 is formed or disposed on the first insulating layer 32 to cover the transducer devices 1, the cap structures 30b and the conductive pillars 50. The protection material 38 has a first surface 381 contacting the first insulating layer 32 and a second surface 382 opposite to the first surface 381.

Figure 69:
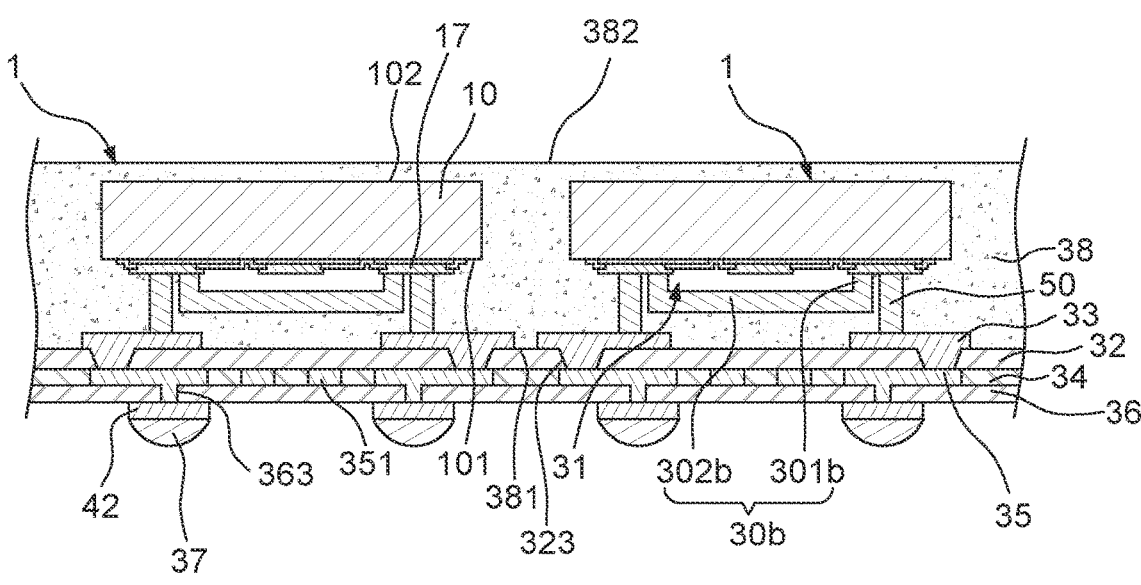
FIG. 69 illustrates one or more stages of an example of a method for manufacturing a package structure according to some embodiments of the present disclosure.

Referring to FIG. 69, the first carrier 52 and the first release layer 56 are removed to expose the bottom metal layer 54. Then, the bottom metal layer 54 is patterned to form the third redistribution layer (RDL) 42. Then, the electrical connecting elements 37 are formed or disposed on the third redistribution layer (RDL) 42 for external connection. Then, a singulation process is conducted to obtain the package structure 3g of FIG. 13.

FIG. 70 through FIG. 74 illustrate an example of a method for manufacturing a package structure according to some embodiments of the present disclosure. In some embodiments, the method is for manufacturing a package structure such as the package structure 3h shown in FIG. 14.

Figure 70:
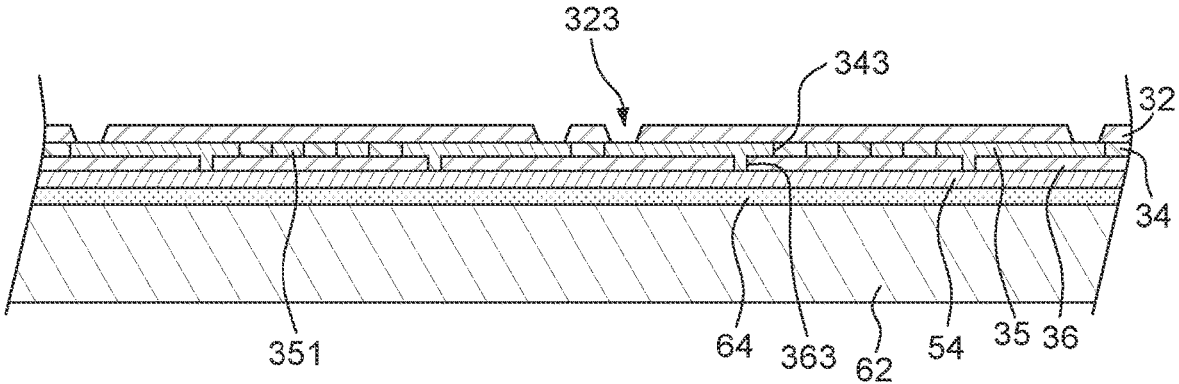
FIG. 70 illustrates one or more stages of an example of a method for manufacturing a package structure according to some embodiments of the present disclosure.

Referring to FIG. 70, a carrier 62 with a release layer 64 is provided. Then, a bottom metal layer 54 is formed or disposed on the release layer 64. Then, the third insulating layer 36 is formed on the bottom metal layer 54. The third insulating layer 36 defines at least one opening 363 extending through the third insulating layer 36. Then, the second insulating layer 34 is formed or disposed on the third insulating layer 36. The second insulating layer 34 defines at least one opening 343 to expose the opening 363. Then, the second redistribution layer (RDL) 35 is formed or disposed on the third insulating layer 36 and in the opening 363, and in the opening 343 of the second insulating layer 34. Then, the first insulating layer 32 is formed or disposed to cover the second insulating layer 34 and the second redistribution layer (RDL) 35. The first insulating layer 32 defines at least one opening 323 to expose a portion of the second redistribution layer (RDL) 35.

Figure 71:
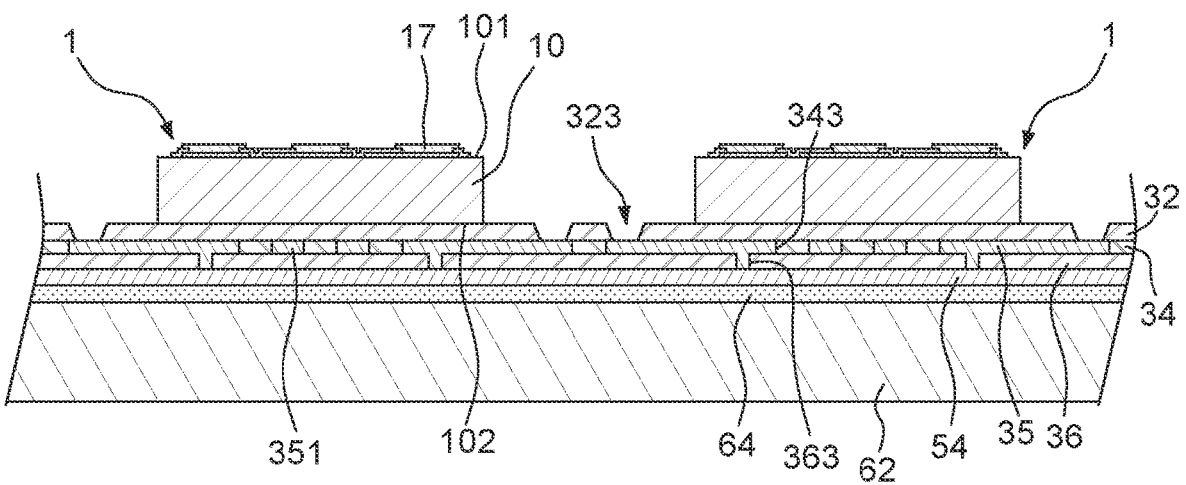
FIG. 71 illustrates one or more stages of an example of a method for manufacturing a package structure according to some embodiments of the present disclosure.

Referring to FIG. 71, a plurality of transducer devices 1 are disposed on or are adhered to the first insulating layer 32 side by side. The second surface 102 of the die body 10 faces the carrier 62 and is attached to the first insulating layer 32.

Figure 72:
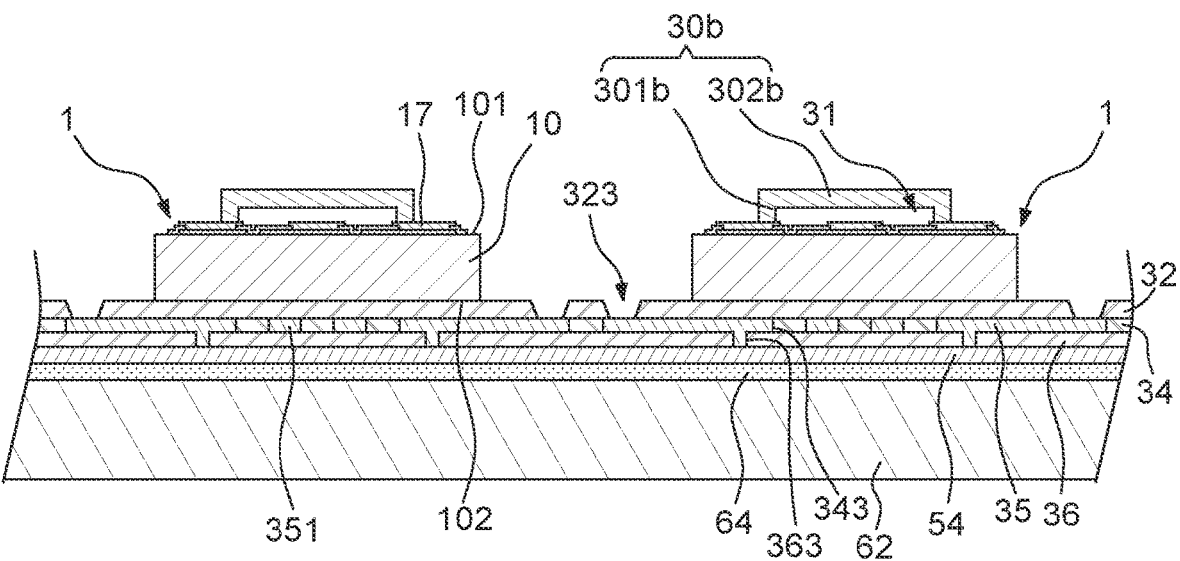
FIG. 72 illustrates one or more stages of an example of a method for manufacturing a package structure according to some embodiments of the present disclosure.

Referring to FIG. 72, the cap structure 30*b* is formed or disposed to cover the transducing region 12 of the transducer device 1 to form an enclosed space 31. The cap structure 30*b* may be a monolithic structure, and may include a side wall portion 301*b* and a roof portion 302*b*. Alternatively, the cap structure 30*b* may be the same as the cap structure 30 of FIG. 40.

Figure 73:
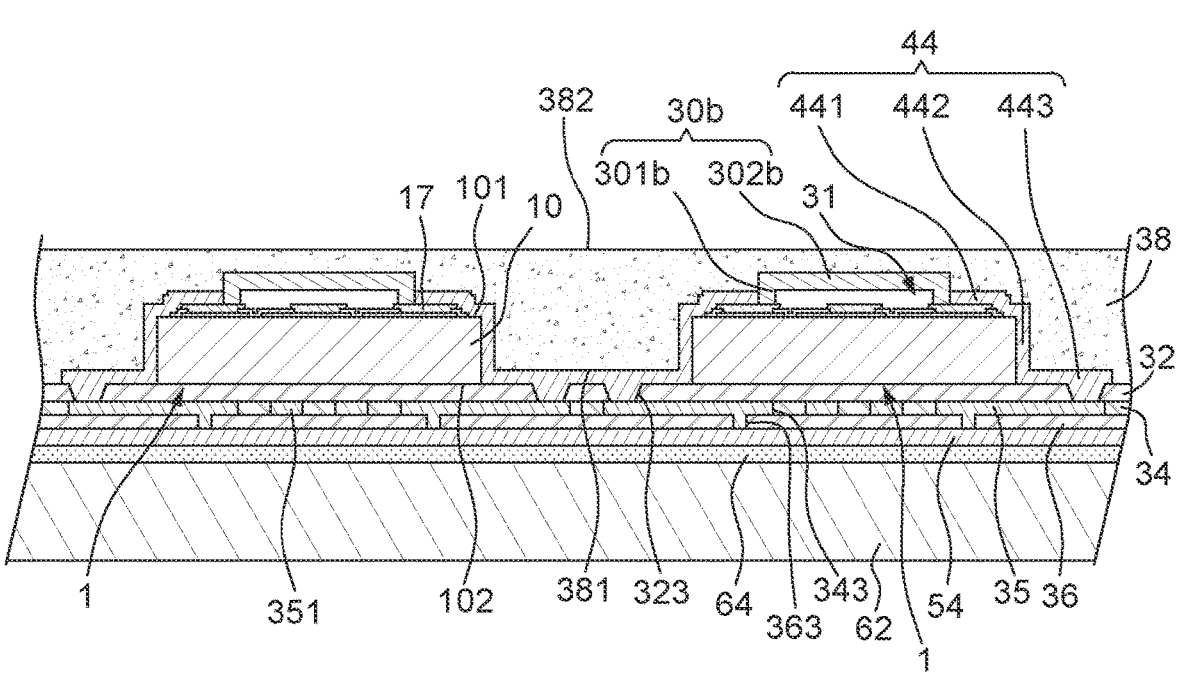
FIG. 73 illustrates one or more stages of an example of a method for manufacturing a package structure according to some embodiments of the present disclosure.

Referring to FIG. 73, a bottom redistribution layer (RDL) 44 is formed to electrically connect the transducer devices 1. The bottom redistribution layer (RDL) 44 includes a first portion 441, a second portion 442 a third portion 443. The first portion 441 is disposed on and contacts the conductive region 13 of the transducer device 1. The second portion 442 is disposed on and contacts the side surface of the die body 10 of the transducer device 1. The third portion 443 is disposed on the first insulating layer 32. A portion of the third portion 443 is disposed in the opening 323 of the first insulating layer 32 to electrically connect the second redistribution layer (RDL) 35. Then, the protection material 38 is formed or disposed on the first insulating layer 32 to cover the transducer devices 1, the cap structures 30*b* and the bottom redistribution layer (RDL) 44. The protection material 38 has a first surface 381 contacting the first insulating layer 32 and the bottom redistribution layer (RDL) 44 and a second surface 382 opposite to the first surface 381.

Figure 74:
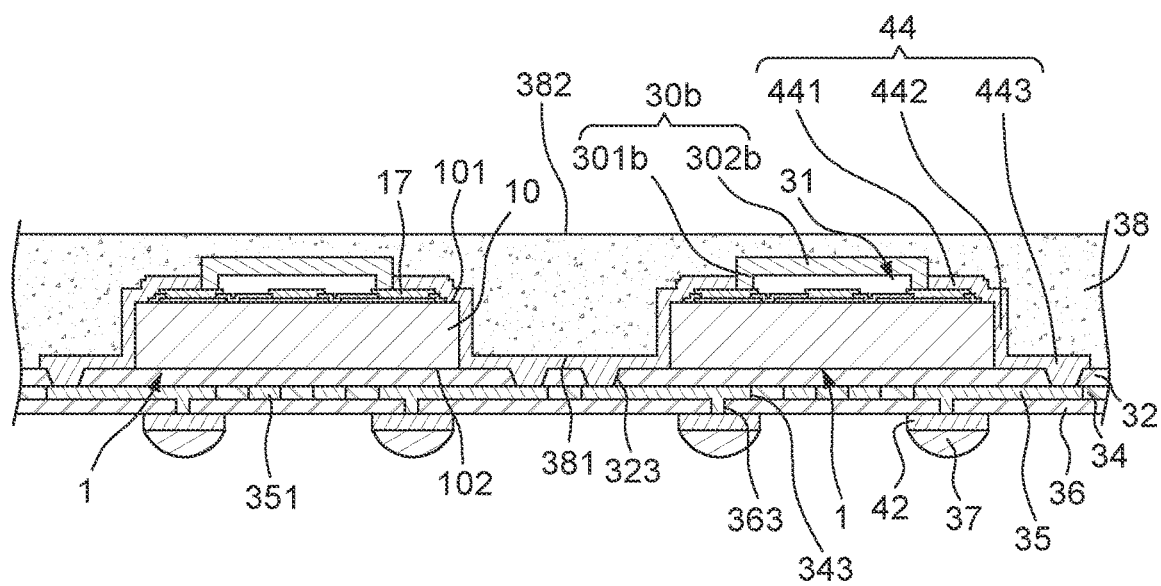
FIG. 74 illustrates one or more stages of an example of a method for manufacturing a package structure according to some embodiments of the present disclosure.

Referring to FIG. 74, the carrier 62 and the release layer 64 are removed to expose the bottom metal layer 54. Then, the bottom metal layer 54 is patterned to form the third redistribution layer (RDL) 42. Then, the electrical connecting elements 37 are formed or disposed on the third redistribution layer (RDL) 42 for external connection. Then, a singulation process is conducted to obtain the package structure 3*h* of FIG. 14.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
a plurality of filters each having a die body;
a protection material covering the plurality of filters;
a first insulating layer directly contacting both the die body of a first one of the plurality of filters and the protection material;

a first redistribution layer (RDL) connecting the first one of the plurality of filters with a second one of the plurality of filters; and
a circuit structure carrying and electrically connecting the plurality of filters,
wherein the first one of the plurality of filters includes a conductive element, wherein the circuit structure includes the first redistribution layer (RDL) and a second insulating layer defining an opening exposing a portion of the first redistribution layer (RDL), wherein the conductive element is electrically connected to the first redistribution layer (RDL) through a pad in the opening of the second insulating layer,
wherein a portion of the protection material is disposed in the opening of the second insulating layer.

2. The package structure of claim 1, wherein the pad is spaced apart from the first insulating layer.

3. The package structure of claim 1, wherein the first insulating layer includes a cap structure defining a space to accommodate a transducing element of the first one of the plurality of filters.

4. The package structure of claim 1, wherein a portion of a bottom surface of the die body of the first one of the plurality of filters is exposed from the first insulating layer.

* * * * *